United States Patent
Fujioka et al.

(10) Patent No.: US 6,847,570 B2
(45) Date of Patent: Jan. 25, 2005

(54) SEMICONDUCTOR MEMORY HAVING BURST TRANSFER FUNCTION AND INTERNAL REFRESH FUNCTION

(75) Inventors: Shinya Fujioka, Kawasaki (JP); Yoshiaki Okuyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/300,800

(22) Filed: Nov. 21, 2002

(65) Prior Publication Data

US 2003/0198098 A1 Oct. 23, 2003

(30) Foreign Application Priority Data

Apr. 15, 2002 (JP) ........................... 2002-111877
May 30, 2002 (JP) ........................... 2002-156832

(51) Int. Cl.[7] .............................................. G11C 7/00
(52) U.S. Cl. .................. 365/222; 365/233; 365/230.08; 365/230.09; 365/189.05; 365/189.07
(58) Field of Search ................................. 365/222, 233, 365/230.08, 230.09, 189.05, 189.07

(56) References Cited

U.S. PATENT DOCUMENTS

| | | | |
|---|---|---|---|
| 5,557,578 A | 9/1996 | Kelly | 365/222 |
| 5,901,101 A | 5/1999 | Suzuki et al. | 365/222 |
| 6,014,339 A | 1/2000 | Kobayashi et al. | 365/233 |
| 6,028,804 A * | 2/2000 | Leung | 365/222 |
| 6,075,740 A | 6/2000 | Leung | |
| 6,222,767 B1 | 4/2001 | Kendall et al. | |
| 6,298,413 B1 | 10/2001 | Christenson | 711/106 |
| 6,324,113 B1 | 11/2001 | Tomita | 365/222 |
| 6,587,389 B2 * | 7/2003 | De Paor et al. | 365/222 |
| 2002/0060940 A1 | 5/2002 | Tomita | 365/222 |
| 2002/0145930 A1 | 10/2002 | Bando | 365/222 |

FOREIGN PATENT DOCUMENTS

| | | |
|---|---|---|
| EP | 1 030 313 | 8/2000 |
| EP | 1 235 155 | 8/2002 |

OTHER PUBLICATIONS

European Search Report, Aug. 13, 2004 for EP 02025813.

* cited by examiner

*Primary Examiner*—Connie C. Yoha
(74) *Attorney, Agent, or Firm*—Arent Fox, PLLC

(57) ABSTRACT

A refresh control circuit generates a refresh request in a predetermined cycle. A first burst control circuit outputs a predetermined number of strobe signals in accordance with an access command. A burst access operation is executed by an access command. A data input/output circuit successively inputs data to be transferred to a memory cell array or successively outputs data supplied from the memory cell array, in synchronization with the strobe signals. An arbiter determines which of a refresh operation or a burst access operation is to be executed first, when the refresh request and the access command conflict with each other. Therefore, the refresh operation and burst access operation can be sequentially executed without being overlapped. As a result, read data can be outputted at a high speed, and write data can be inputted at a high speed. That is, the data transfer rate can be improved.

23 Claims, 30 Drawing Sheets

SEMICONDUCTOR MEMORY HAVING BURST TRANSFER FUNCTION AND INTERNAL REFRESH FUNCTION

BACKGROUND OF THE INVENTION

1. Field of the Invention

The present invention relates to semiconductor memories that have volatile memory cells each having a capacitor and that have interfaces as of SRAMs.

2. Description of the Related Art

Recently, mobile devices such as cellular phones and the like have advanced service functions, and handling data amount therein has been increasing. Accordingly, there is a growing demand for large capacities of the work memories incorporated in such mobile devices.

Conventionally, SRAMs having simple system structure are used as the work memories of such mobile devices. However, the SRAMs are disadvantageous in terms of providing large capacities because they require more elements to constitute each one-bit cell than DRAMs. For this reason, semiconductor memories called pseudo SRAMs have been developed, which have both large capacities as of DRAMs and high usability as of SRAMs.

It is expected that mobile devices have further advanced service functions, with development of third-generation cellular phones or mobile terminals. Along with the advancement of mobile devices' functions, it is demanded that the work memories incorporated in such mobile devices have higher speed performances as well as larger capacities.

The conventional pseudo SRAMs have a function, called page mode, to execute a read operation by successively supplying column addresses. The read operation in the page mode is executed by successively supplying column addresses. In general, addresses require large numbers of bits and are supplied not only to the memories but also to other chips in the systems, so that skew is likely to be large. Therefore, the shorter the access cycle is, the greater the ratio of the address skew to the access cycle is likely to be. The greater the address skew becomes, the longer the setup and hold times of the addresses relative to timing signals have to be set. Thus, there exists a problem that the address skew is a hindrance to the shortening of the access cycle and that the data transfer rate therefore cannot be improved.

SUMMARY OF THE INVENTION

It is an object of the present invention to improve the data transfer rate of semiconductor memories having both a great capacity as of DRAMs and a high usability as of SRAMs.

It is another object of the present invention to ensure that the system can easily control the semiconductor memories incorporated therein, simplifying the system configuration.

According to one of the aspects of the semiconductor memory of the present invention, a memory cell array is composed of volatile memory cells each having a capacitor. A refresh control circuit generates in a predetermined cycle a refresh request for refreshing the memory cells. When receiving an access command, the semiconductor memory executes a burst access operation that successively activates the memory cell array. A first burst control circuit outputs a predetermined number of strobe signals corresponding to the access command. A data input/output circuit successively inputs/outputs data to be transferred to/from the memory cell array, in synchronization with each of the strobe signals.

An arbiter determines which of a refresh operation or a burst access operation is to be executed first, when the refresh request and the access command conflict with each other. For example, in a case where the access command is given priority, the refresh operation is executed after the burst access operation. In a case where the refresh request is given priority, the burst access operation is executed after the refresh operation. Therefore, in the semiconductor memory that automatically executes the refresh operation, the refresh and burst access operations can be sequentially executed without being overlapped.

In addition, the burst access operation can be executed without conflict with the refresh operation in the semiconductor memory that automatically executes the refresh operation, so that read data can be outputted at a high speed, and write data can be inputted at a high speed. That is, the data transfer rate can be improved.

According to another aspect of the semiconductor memory of the present invention, the arbiter has a refresh holding part for holding a refresh request during a burst access operation. Therefore, when the burst access operation is executed prior to the refresh operation, the refresh request can be prevented from being lost.

According to another aspect of the semiconductor memory of the present invention, a second burst control circuit outputs a burst signal corresponding to a period during which the predetermined number of strobe signals are outputted. The refresh holding part holding a refresh request outputs a refresh starting signal for starting the refresh operation, in response to a completion of the outputting of the burst signal. Therefore, when the burst access operation is executed prior to the refresh operation, the period from the burst access operation to the starting of the refresh operation can be shortened. This enables earlier supply of the next access command, improving the data transfer rate.

According to another aspect of the semiconductor memory of the present invention, after the operation of the memory cell array, the refresh holding part holding a refresh request outputs a refresh starting signal for starting the refresh operation, without waiting for a completion of the outputting of data transferred from the data input/output circuit. In the refresh operation, no data are inputted from and outputted to the exterior of the semiconductor memory. Therefore, when the burst access operation is given a execution priority, the refresh operation can be started during the burst operation. That is, the period from the burst access operation to the starting of the refresh operation can be further shortened. This realizes earlier supply of the next access command, and hence the data transfer rate can be further improved.

According to another aspect of the semiconductor memory of the present invention, a plurality of word lines each are connected to a predetermined number of memory cells. The semiconductor memory has a full burst function for sequentially selecting the plurality of word lines to sequentially access the memory cells in accordance with an access command. The refresh holding part holding a refresh request during a full burst operation outputs a refresh starting signal for starting the refresh operation, at the time of switching selection/non-selection of the word lines. The switching of word line selection is always necessary in the full burst operation, and the memory cell array is temporarily inactivated during the switching. Executing the refresh operation at the time of switching the word lines can minimize the effect of the refresh operation that interferes with the external access. This prevents a decrease in the data transfer rate even when the refresh operation is inserted in the full burst operation.

According to another aspect of the semiconductor memory of the present invention, the arbiter has an access holding part for holding the access command during the refresh operation, when the refresh operation is executed first. When the refresh operation is executed prior to the burst access operation, therefore, the access request can be prevented from being lost.

According to another aspect of the semiconductor memory of the present invention, an address counter receives an external address supplied corresponding to an access command and sequentially generates internal addresses that follow the external address. Therefore, only one reception of the external command allows the burst access operation to be executed, and the effect due to the skew of external address can be reduced. This can shorten the operation cycle independently of the address skew. As a result, the data transfer rate can be further improved.

According to another aspect of the semiconductor memory of the present invention, the memory cell array is inactivated after read data are transferred to a data register. The quick inactivation of the memory cell array during the burst read operation allows earlier start of an operation responsive to a refresh request or the next access request. As a result, the data transfer rate can be improved.

According to another aspect of the semiconductor memory of the present invention, the burst control circuit outputs strobe signals in synchronization with external clock signals. That is, even in a clock-synchronous semiconductor memory in which the refresh is automatically executed, the data transfer rate can be improved.

According to another aspect of the semiconductor memory of the present invention, a wait signal indicative of invalidity of data output terminals is outputted from a wait terminal during a period from the reception of an access command to the outputting of read data. Therefore, the system where the semiconductor memories are mounted can access the semiconductor memory with an optimum timing in accordance with the wait signal. For example, the CPU or the like that manages the system can access a different device during the outputting of the wait signal. As a result, the usage efficiency of the system buses can be improved.

According to another aspect of the semiconductor memory of the present invention, data are inputted/outputted via a plurality of data input/output terminals. A plurality of data terminal groups each are constituted of a predetermined number of data input/output terminals. Data valid signals supplied to data valid terminals corresponding to the data terminal groups indicate whether data transferred to the respective data terminal groups are valid or not. Therefore, even when the bit width of data is large, the system incorporating the semiconductor memory can efficiently execute data write and read operations.

According to another aspect of the semiconductor memory of the present invention, column switches connect the memory cells to the data input/output circuit. Each of column switch groups, which correspond to the data terminal groups, is constituted of a predetermined number of column switches. A control circuit turns off, during invalidity of a data valid signal, the column switches of a column switch group corresponding to the invalid data valid signal. During the write operation, the column switches operate at a relatively late timing. Therefore, using the column switches to mask the write data allows the mask control of the write data to be easily performed.

According to another aspect of the semiconductor memory of the present invention, a mode setting control circuit receives, as a set signal for setting the operation mode, a signal supplied to at least one of external input terminals after signals of predetermined logic values are supplied to the external input terminals a plurality of times successively. Since the operation mode can be set by utilizing such a combination of address and command signals that normally cannot occur, there is no need to provide any dedicated terminals for setting the operation mode. For example, the latency that is the number of clocks from the reception of an access command to the starting of the output of read data is set as the operation mode. Also, the burst length that is the number of times data are successively inputted or outputted is set as the operation mode.

According to another aspect of the semiconductor memory of the present invention, a first burst control circuit outputs a predetermined number of strobe signals corresponding to an access command for successively burst accessing the memory cell array. At this moment, a level detecting circuit of the first burst control circuit detects that one of the command signals supplied as the access command turns to its active level. The command signals are, for example, a chip enable signal, an output enable signal, a write enable signal, and the like. An output control circuit of the first burst control circuit starts outputting the strobe signals after measuring a predetermined time from the detection of the level detecting circuit. A data input/output circuit successively inputs/outputs data to be transferred to/from the memory cell array, in synchronization with each of the strobe signals.

The outputting of read data or the inputting of write data starts the predetermined time after the level change of a predetermined command signal, so that the system incorporating the semiconductor memory can easily control the semiconductor memory. That is, the system configuration can be simplified. The semiconductor memory starts the data input/output operations by utilizing the level changes of the command signals as triggers. Therefore, the present invention can be applied to both clock-synchronous semiconductor memories and clock-asynchronous semiconductor memories.

According to another aspect of the semiconductor memory of the present invention, the first burst control circuit measures the predetermined time in accordance with a value set in a mode register.

According to another aspect of the semiconductor memory of the present invention, the predetermined time is modified in accordance with the voltage value of connecting destination of a conductive pattern, which is formed on the semiconductor substrate, in accordance with the pattern shape of a photomask used in a fabrication process of the semiconductor memory. The predetermined time can be set in accordance with the product specifications (the operating frequency and the like) of shipping semiconductor memories. This is especially advantageous in a case where semiconductor memories fabricated through the same fabrication process and having sufficient margin in operating frequency are shipped as different products by changing photomasks according to the operating frequency.

According to another aspect of the semiconductor memory of the present invention, the predetermined time is modified in accordance with the programming of a fuse. Therefore, for example, programming the fuse according to the highest operating frequency as evaluated in a probe test can set the predetermined time in conformity with the actual performance of fabricated semiconductor memories. This is particularly advantageous when semiconductor memories fabricated by using the same photomask and fabrication process are classified into different products for shipment according to their operating frequencies.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Embodiments of the present invention will be described below with reference to the drawings.

Figure 1:
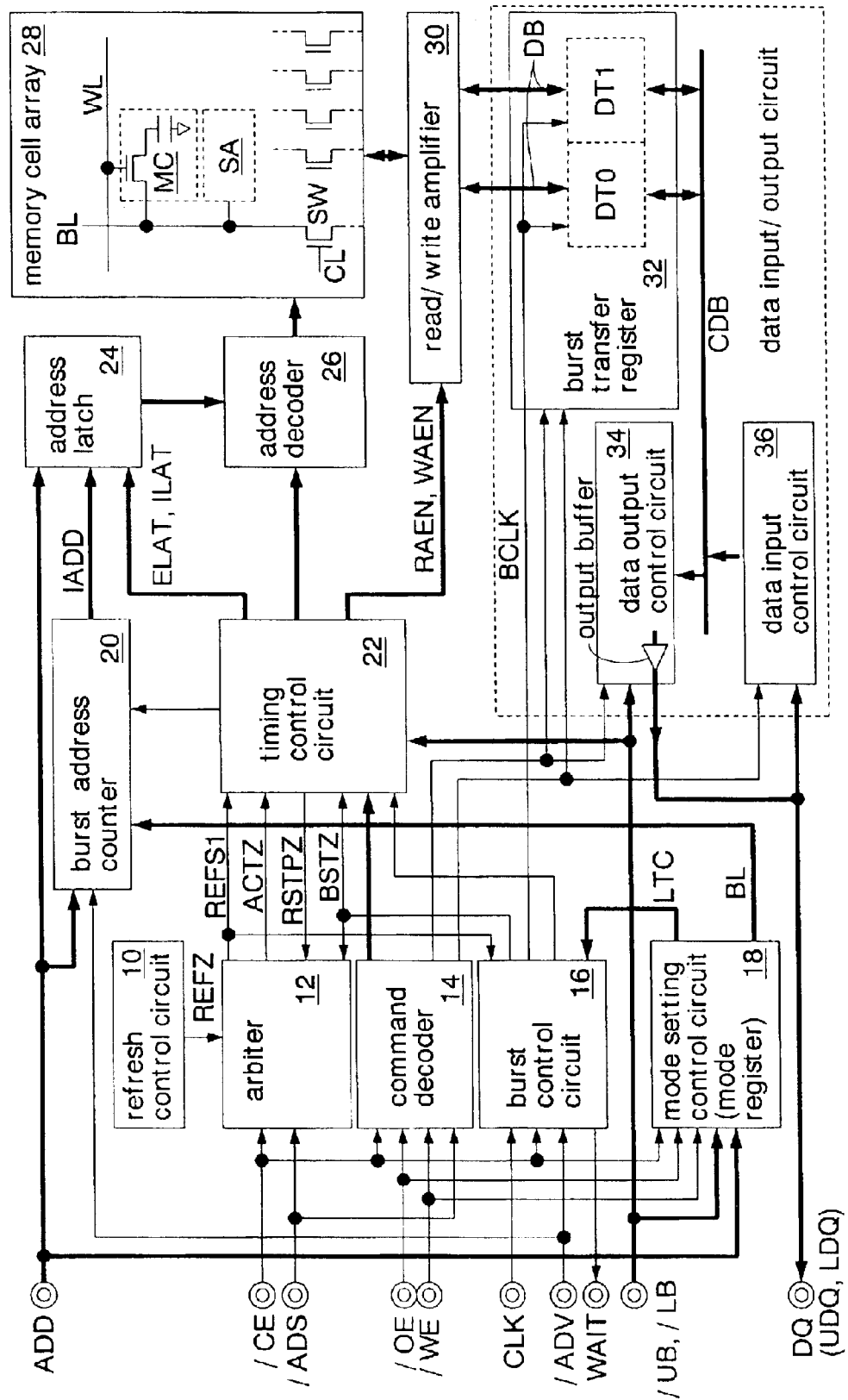
FIG. 1 is a block diagram showing a first embodiment of the present invention.

FIG. 1 shows a first embodiment of semiconductor memory according to the present invention. In the figure, each of the signal lines shown by thick lines is constituted by a plurality of bits. Double circles shown on the left side of the figure designate external input terminals. The signals identified by designations prefixed with "/" represent negative logics, while the signals identified by designations postfixed with "Z" represent positive logics. In the following descriptions, signals may be referred to by using their respective abbreviations; for example, "external clock signal CLK" may be referred to as "CLK signal", and "chip enable signal /CE" may be referred to as "/CE signal".

This semiconductor memory is formed as a pseudo SRAM having memory cells as of a DRAM and also having interfaces as of an SRAM. This pseudo SRAM has a refresh control circuit 10, an arbiter 12, a command decoder 14, a burst control circuit 16, a mode setting control circuit 18, a burst address counter 20, a timing control circuit 22, an address latch 24, an address decoder 26, a memory cell array 28, a read/write amplifier 30, a burst transfer register 32, a data output control circuit 34, and a data input control circuit 36.

The refresh control circuit 10, incorporating a timer, outputs in a predetermined cycle a refresh request signal REFZ for refreshing the memory cells MC of the memory cell array 28.

The arbiter 12 judges which is the first to arrive, the refresh request signal REFZ or an access command, and outputs a control signal in accordance with the signal having arrived first. The access command is supplied from the exterior to the pseudo SRAM when the memory cell array 28 is successively accessed (burst accessed) and a read or write operation is successively executed. The access command is recognized when a chip enable signal /CE and an address status signal /ADS both exhibit low levels. In a burst access, a plurality of data are outputted or inputted at one access command (a burst access operation).

When judging that the refresh request signal REFZ is the first to arrive, the arbiter 12 outputs a refresh starting signal REFS1 and an active signal ACTZ. When judging that the access command is the first to arrive, the arbiter 12 outputs an active signal ACTZ. The chip enable signal /CE and address status signal /ADS are supplied via a chip enable terminal and an address status terminal, respectively. The pseudo SRAM validates an address signal ADD supplied thereto when the address status signal /ADS exhibits the low level. Conversely, the pseudo SRAM invalidates an address signal ADD supplied thereto when the address status signal /ADS exhibits a high level. It should be appreciated that since the pseudo SRAM has the SRAM interfaces, the row and column addresses of the address signal ADD are supplied at the same time.

When the address status signal /ADS exhibits the low level, the command decoder 14 decodes the chip enable signal /CE, an output enable signal /OE and a write enable signal /WE (each of which also will be generically referred to as "command signal CMD"), and outputs control signals, which are in accordance with the result of decoding, to the timing control circuit 22, data output control circuit 34, data input control circuit 36 and so on. The output enable signal /OE and write enable signal /WE are supplied via an output enable terminal and a write enable terminal, respectively. The chip enable, output enable and write enable terminals each also will be generically referred to as "command terminal".

The burst control circuit 16 receives external clock signals CLK, the chip enable signal /CE, a burst address advance signal /ADV, and a latency signal LTC supplied from the mode setting control circuit 18, and outputs a burst signal BSTZ, burst clock signals BCLK (a strobe signal), a timing signal, which is supplied to the timing control circuit 22, and a wait signal WAIT. The external clock signals CLK and burst address advance signal /ADV are supplied via an external clock terminal and a burst address advance terminal, respectively. The wait signal WAIT is outputted to the exterior to the pseudo SRAM via a wait terminal. The burst control circuit 16 operates as a first burst control circuit for outputting the burst clock signals BCLK, and operates as a second burst control circuit for outputting the burst signal BSTZ.

The mode setting control circuit 18 receives the chip enable signal /CE, the output enable signal /OE, the write enable signal /WE, an upper byte signal /UB (a first data valid signal), a lower byte signal /LB (a second data valid signal), and the address signal ADD, and outputs the latency signal LTC and a burst length signal BL. The /UB and /LB signals are supplied via an upper byte terminal (a first data valid terminal) and a lower byte terminal (a second data valid terminal), respectively. The /UB and /LB signals are signals for masking a part of read and write data.

The mode setting control circuit 18 is a circuit for setting the operation modes of the pseudo SRAM and has a mode register that can be set from the exterior. The latency LTC and burst length BL can be set as the operation modes. The set latency LTC and burst length BL are outputted as the latency signal LTC and burst length signal BL, respectively. The latency LTC is the number of clocks from a time point when an access command (a read command) is supplied to a time point when the first data are outputted. The burst length BL is the number of times data are inputted or outputted, which corresponds to one access command.

The burst address counter 20 generates, in synchronization with a timing signal from the timing control circuit 22, an internal address signal IADD that follows the address signal ADD. The burst address counter 20 generates the internal address signal IADD a number of times that is one less than the burst length represented by the burst length signal BL. The burst address counter 20, while receiving a high level of the burst address advance signal /ADV, stops the count-up operation. The address signal ADD is supplied via an address terminal.

The timing control circuit 22 receives the control signals from the arbiter 12, command decoder 14, burst control circuit 16 and so on, and outputs timing signals for controlling the operations of the burst address counter 20, address latch 24, address decoder 26, read/write amplifier 30 and so on.

The address latch 24 latches the address signal ADD in synchronization with an address latch signal ELAT, also latches the internal address signal IADD in synchronization with an address latch signal ILAT, and outputs the latched signals to the address decoder 26.

The address decoder 26 decodes the address signals latched by the address latch 24, and outputs signals for selecting memory cells MC in the memory cell array 28. More specifically, the address decoder 26 outputs, in accordance with the address signals, a word line signal for selecting a word line WL, which will be described later, and column line signals for turning on column switches SW, which also will be described later.

The memory cell array 28 has a plurality of volatile memory cells MC arranged in a matrix; a plurality of word lines WL connected to the memory cells MC; a plurality of bit lines BL also connected to the memory cells MC; a plurality of sense amplifiers SA connected to the bit lines BL; and a plurality of column switches SW for connecting the bit lines BL to the read/write amplifier 30. The memory cells MC, like the ones of a typical DRAM, each have a capacitor for holding data as a charge and also have a transfer transistor disposed between the capacitor and an associated bit line BL. The gate of each transfer transistor is connected to an associated word line WL.

The column switches SW are classified into a first column switch group corresponding to the /UB signal and a second column switch group corresponding to the /LB signal. During a burst write operation, the first group of column switches are turned on in response to the address signals only when the /UB signal exhibits a low level. During the burst write operation, the second group of column switches are turned on in response to the address signals only when the /LB signal exhibits a low level. That is, write data are masked by controlling the column switches SW.

Practically, the timing control circuit 22 activates, in response to the /UB and /LB signals, the address decoder 26, which outputs column selecting signals CL, thereby controlling the operations of the first and second column switch groups. The write data mask control may be performed until the write data received at data input/output terminals DQ are transferred to the column switches SW. Therefore, the write data mask control can be easily carried out.

The read/write amplifier 30 outputs, in synchronization with a read amplifier enable signal RAEN, parallel read data supplied from the memory cell array 28 to data buses DB. The read/write amplifier 30 also outputs, in synchronization with a write amplifier enable signal WAEN, parallel write data supplied from the burst transfer register 32 to the memory cell array 28.

The burst transfer register 32 has a plurality of data registers (DT0, DT1 and others) for holding data. The burst transfer register 32 converts the parallel read data from the read/write amplifier 30 into serial data, and outputs, in synchronization with the burst clock signals BCLK, the serial data to a common data bus CDB. The burst transfer register 32 also converts serial write data from the common data bus CDB into parallel data, and outputs, in synchronization with the burst clock signals BCLK, the parallel data to the read/write amplifier 30.

The data output control circuit 34, activated during a read operation, outputs the read data on the common data bus CDB to the data input/output terminals DQ via output buffers. The data input/output terminals DQ are constituted by sixteen bits. The data output control circuit 34 outputs the upper eight bits of the sixteen-bit read data when the upper byte signal /UB exhibits a low level. The data output control circuit 34 outputs the lower eight bits of the sixteen-bit read data when the lower byte signal /LB exhibits a low level. The data input/output terminals DQ are constituted by a first data terminal group UDQ of eight bits corresponding to the /UB signal and a second data terminal group LDQ of eight bits corresponding to the /LB signal.

The data input control circuit 36, activated during a write operation, receives write data via the data input/output terminals DQ, and outputs the received data to the common data bus CDB. The burst transfer register 32, data output control circuit 34 and data input control circuit 36 operate as a data input/output circuit for successively inputting or outputting a plurality of data.

Figure 2:
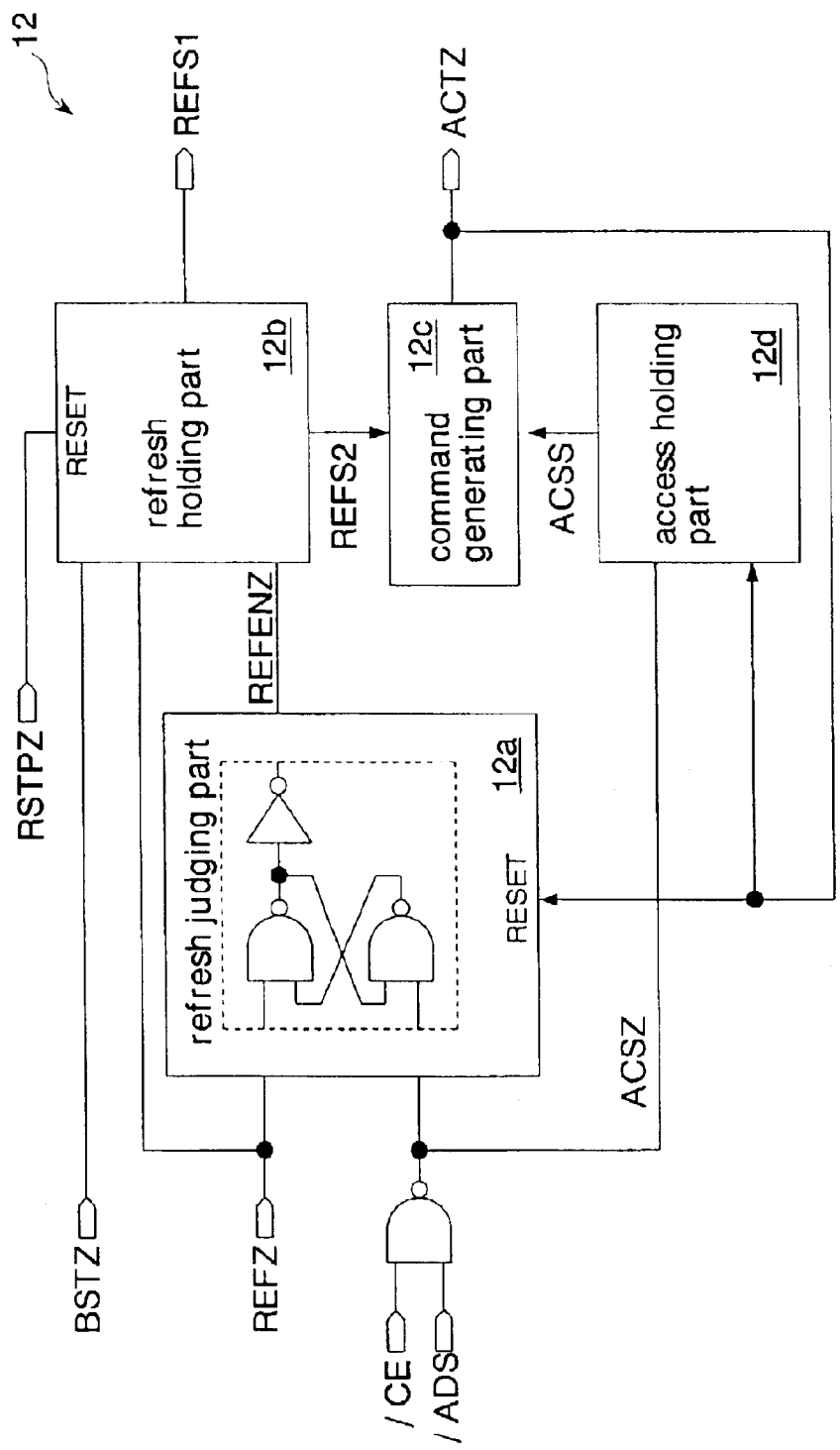
FIG. 2 is a block diagram showing the details of the arbiter of FIG. 1.

FIG. 2 shows the details of the arbiter 12 shown in FIG. 1.

The arbiter 12 has a refresh judging part 12a, a refresh holding part 12b, a command generating part 12c, and an access holding part 12d.

The refresh judging part 12a, which has an RS flip-flop, operates during a low level of the active signal ACTZ, and judges which is the first to arrive, the refresh request signal REFZ or an access signal ACSZ. The access signal ACSZ is a signal indicative of the OR logic (negative logic) of the /CE and /ADS signals. That is, when the /CE or /ADS signal changes to a low level, the supply of an access command is detected and the ACSZ signal is outputted. The refresh judging part 12a, when judging that the REFZ signal is the first to arrive, causes a refresh enable signal REFENZ to change to a high level. The refresh judging part 12a, when judging that the ACSZ signal is the first to arrive, holds the refresh enable signal REFENZ at a low level.

The refresh holding part 12b holds the refresh request signal REFZ when the refresh enable signal REFENZ exhibits the low level or when the burst signal BSTZ exhibits a high level. The held refresh request signal REFZ is outputted as the refresh starting signal REFS1 and as a refresh starting signal REFS2 in synchronization with a falling edge of the burst signal BSTZ. The refresh holding part 12b outputs the refresh starting signals REFS1 and REFS2 in response to the refresh request signal REFZ when the refresh enable signal REFENZ exhibits the high level and further when the burst signal BSTZ exhibits the low level. The refresh holding part 12b stops outputting the refresh starting signal REFS1 in synchronization with a refresh stopping signal RSTPZ outputted at the completion of the refresh operation.

The burst signal BSTZ is a signal that is outputted during a burst access operation (during a burst read or write operation). That is, according to the present invention, during a burst operation, the refresh request is not lost but held, and the refresh operation corresponding to the held refresh request is executed after the burst operation of the memory cell array 28 (before the completion of the burst operation of the pseudo SRAM). Therefore, the time from the burst operation to the starting of the refresh operation can be shortened, so that the data transfer rate can be improved.

The command generating part 12c outputs the active signal ACTZ in response to the refresh starting signal REFS2 or an access starting signal ACSS. The outputting of the active signal ACTZ allows the burst access operation or refresh operation to be executed.

The access holding part 12d outputs the access starting signal ACSS in response to the access signal ACSZ when the active signal ACTZ exhibits a low level. In a case where the access holding part 12d receives the access signal ACSZ during a high level of the active signal ACTZ, it does not lose but does hold the access signal ACSZ, and it outputs the held access signal ACSZ as the access starting signal ACSS in synchronization with the falling edge of the active signal ACTZ. In general, during the burst access operation, while the memory cell array 28 is operating, no new access command causes any request for accessing the memory cell array 28 to be supplied. Therefore, the holding of the access signal ACSZ is performed while the active signal ACTZ is being outputted in association with the refresh operation.

Figure 3:
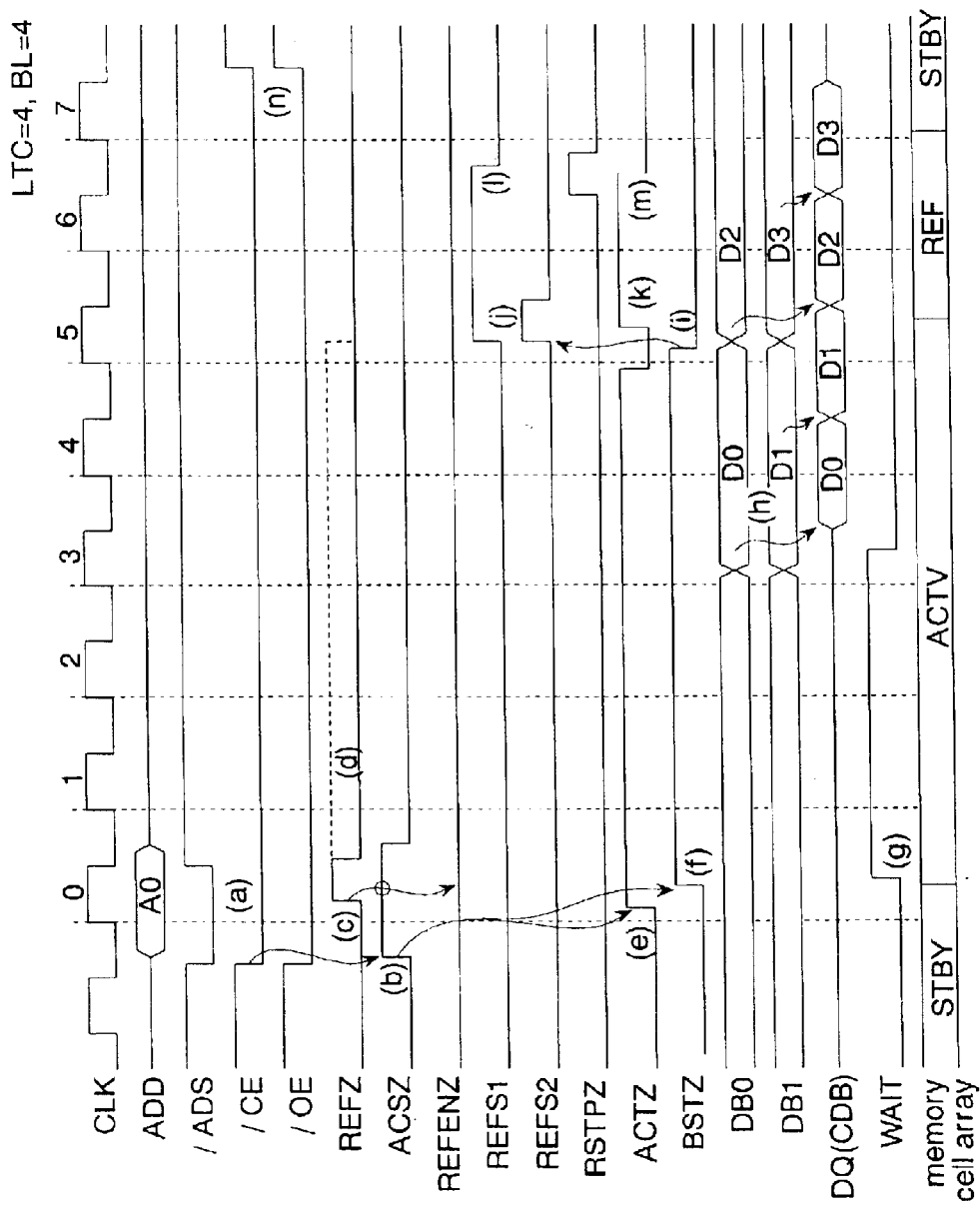
FIG. 3 is a timing diagram showing an operation of the arbiter of FIG. 2.

FIG. 3 shows an operation of the arbiter 12 shown in FIG. 2. FIG. 3 shows a case where a refresh request occurs immediately after an access command is received. That is, a refresh operation is executed after a burst read operation. In this example, the read latency is set to "4", and the burst length is set to "4".

Firstly, an address signal ADD (A0) and /ADS, /CE and /OE signals are supplied in synchronization with the rising edge of the zeroth CLK signal (FIG. 3(a)). That is, a read command is supplied. The arbiter 12 outputs an access signal ACSZ in response to the /ADS and /CE signals (FIG. 3(b)).

After the access signal ACSZ is outputted, a refresh request signal REFZ is outputted (FIG. 3(c)). The refresh judging part 12a judges that the ACSZ signal is the first to arrive, and holds the refresh enable signal REFENZ at a low level. The refresh holding part 12b receives the low level of the REFENZ signal, and holds the refresh request signal REFZ until a starting of the refresh operation, as shown by dashed lines in the figure (FIG. 3(d)).

The access holding part 12d receives the ACSZ signal and outputs the access starting signal ACSS. The command generating part 12c receives the ACSS signal and outputs an active signal ACTZ (FIG. 3(e)). The ACTZ signal's turning to the high level causes the memory cell array 28 to shift from a standby state STBY to an active state ACTV.

The burst control circuit 16 shown in FIG. 1 receives an access command and outputs a burst signal BSTZ (FIG. 3(f)) and a wait signal WAIT (FIG. 3(g)). The system incorporating the pseudo SRAM, receiving the wait signal WAIT to detect that no read data are outputted from the pseudo SRAM, may access another device for example. Therefore, the utilization ratio of the system bus is improved.

Thereafter, the burst read operation is started, and the first read data D0 and D1 are outputted to the data buses DB (FIG. 3(h)). Thereafter, the read operation of the memory cell array 28 is completed, and the read data D2 and D3 are outputted. The burst control circuit 16 causes the burst signal BSTZ to change to a low level (FIG. 3(i)).

The memory cell array 28 is deactivated after the read data D2 and D3 are outputted. The refresh holding part 12b of the arbiter 12 outputs refresh starting signals REFS1 and REFS2 for starting the refresh operation in synchronization with the falling edge of the burst signal BSTZ (FIG. 3(j)). Thus, the refresh starting signals REFS1 and REFS2 are outputted, after the operation of the memory cell array 28, without waiting for the completion of the outputting of the read data D2 and D3 from the burst transfer register 32. Starting, before the completion of the outputting of the read data, the refresh operation that does not use the data buses DB can improve the utilization ratio of the data buses DB. More specifically, the next access command can be received with an earlier timing.

The active signal ACTZ changes, in response to the refresh starting signal REFS2, to the high level again, which causes the refresh operation to be executed (FIG. 3(k)). That is, the state of the memory cell array 28 changes to a refresh state REF while the read data D2 and D3 are being transferred to the data input/output terminals DQ.

A refresh stopping signal RSTPZ is outputted in synchronization with a completion of the refresh operation, and the refresh starting signal REFS1 and active signal ACTZ change to their respective low levels (FIGS. 3(*l*), (*m*)). Then, the state of the memory cell array 28 changes to a standby state STBY. Thereafter, /CE and /OE signals are caused to exhibit their respective high levels, resulting in a completion of the burst read operation (FIG. 3(*n*)).

Figure 4:
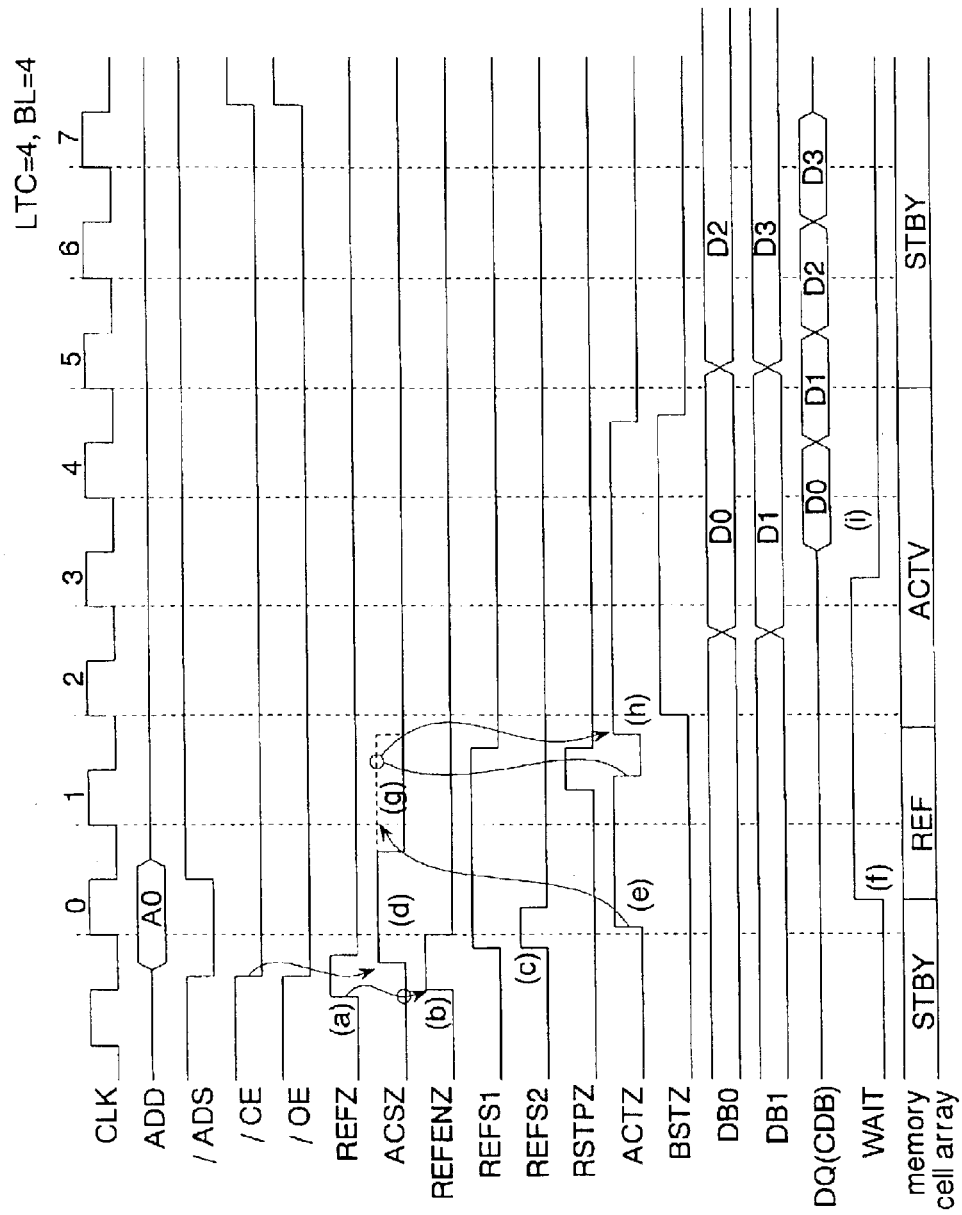
FIG. 4 is a timing diagram showing another operation of the arbiter of FIG. 2.

FIG. 4 is a timing diagram showing another operation of the arbiter 12. Detailed descriptions of operations corresponding to the same operations of FIG. 3 are omitted. FIG. 4 shows a case where a refresh request occurs immediately before an access command is received. That is, a refresh operation is executed prior to a burst read operation. In this example, the read latency is set to "4", and the burst length is set to "4".

Firstly, a refresh request signal REFZ is outputted (FIG. 4(*a*)). The refresh judging part 12*a* judges that the refresh request signal REFZ is the first to arrive, and causes a refresh enable signal REFENZ to change to a high level (FIG. 4(*b*)). At this moment, since the memory cell array 28 is in a standby state STBY, a burst signal BSTZ has not been outputted. Accordingly, the refresh holding part 12*b* receives the REFENZ signal and outputs refresh starting signals REFS1 and REFS2 (FIG. 4(*c*)).

Thereafter, in synchronization with the rising edge of the zeroth CLK signal, an address signal ADD (A0) and /ADS, /CE and /OE signals are supplied, and an access signal ACSZ changes to a high level (FIG. 4(*d*)). The command generating part 12*c* outputs an active signal ACTZ in response to the refresh starting signal REFS2 (FIG. 4(*e*)). Then, the refresh operation is executed. A wait signal WAIT changes to a high level during the refresh operation and at the beginning of the active period (FIG. 4(*f*)). A detailed description of the wait signal WAIT will be made later with reference to FIG. 6.

The access holding part 12*d* receives the high level of the ACTZ signal and holds the ACSZ signal (FIG. 4(*g*)). The access holding part 12*d* outputs the ACTZ signal in synchronization with the falling edge of the ACTZ signal corresponding to a completion of the refresh operation (FIG. 4(*h*)). The ACTZ signal's turning to the high level causes the memory cell array 28 to shift from the refresh state REF directly to an active state ACTV without undergoing a standby state STBY. Accordingly, the burst read operation can be started earlier.

Thereafter, similarly to FIG. 3, the burst read operation is executed, and read data D0–D3 are outputted (FIG. 4(*i*)).

Figure 5:
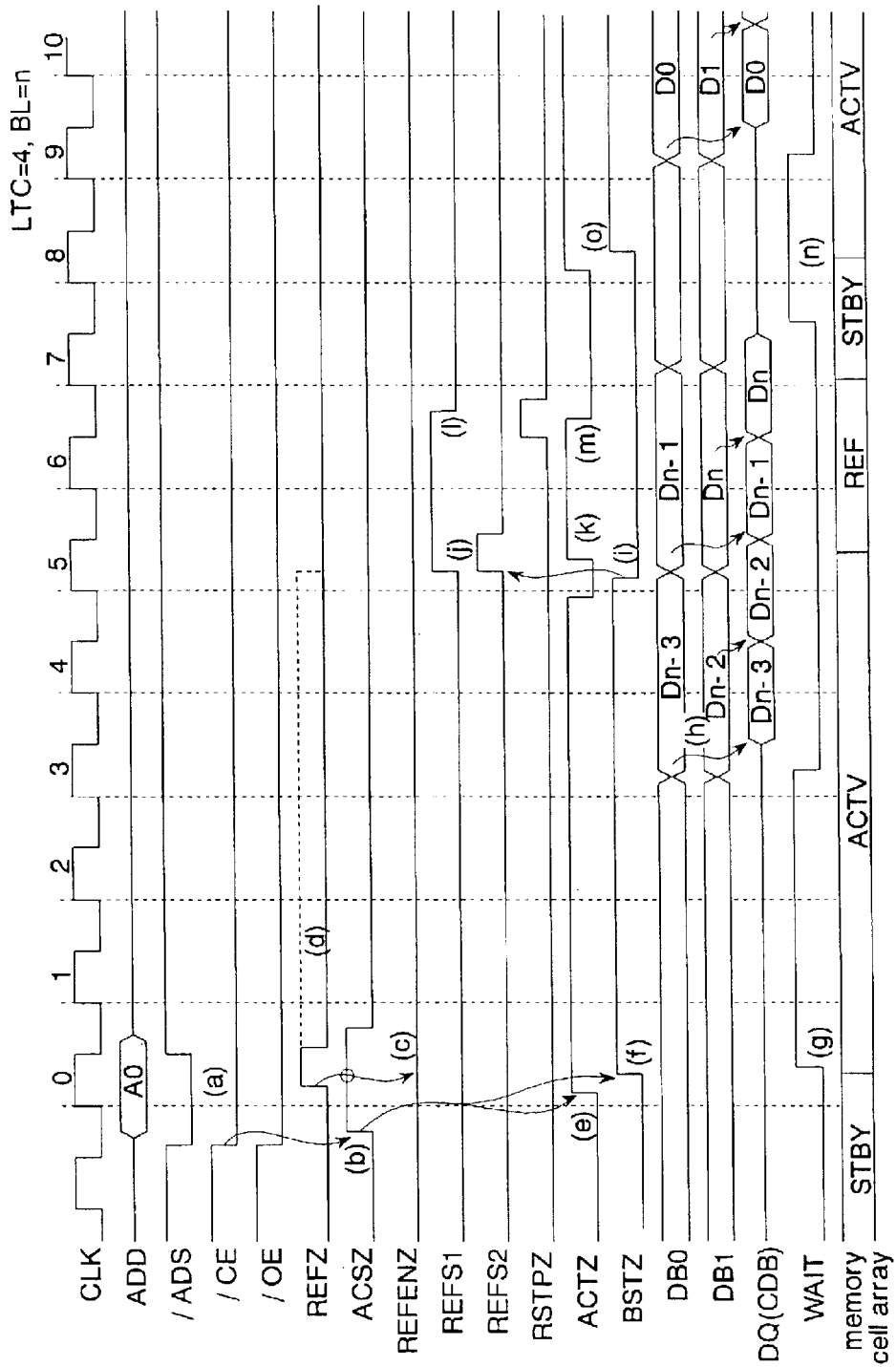
FIG. 5 is a timing diagram showing still another operation of the arbiter of FIG. 2.

FIG. 5 is a timing diagram showing still another operation of the arbiter 12. Detailed descriptions of operations corresponding to the same operations of FIG. 3 are omitted. FIG. 5 shows a case where when a full burst mode has been established as the operation mode, a refresh request occurs immediately after an access command is received. The "full burst mode (full burst function)" is an operation mode in which during the low level of the /CE signal, data are successively outputted (or inputted) in response to one access command.

In the full burst mode, the burst address counter 20 shown in FIG. 1 sequentially generates internal address signals IADD during the low level of the /CE signal. More particularly, after the internal address signals IADD corresponding to selected word lines WL are sequentially generated, the internal address signals IADD corresponding to the adjacent word lines WL are sequentially generated. That is, during the full burst operation, the selections of the word lines WL are switched.

In the figure, the word lines WL corresponding to read data Dn–3, Dn–2, Dn–1 and Dn are different from the word lines WL corresponding to the read data D0, D1, D2 and D3. That is, the selections of the word lines WL are switched during the eighth clock period. A refresh operation is executed when the word lines WL are switched. The operations designated by reference labels (a) through (m) in FIG. 5 are the same as the operations designated by the same reference labels in FIG. 3, and hence their detailed descriptions are omitted.

During the period when read data cannot be outputted due to the switching of the word lines WL, a wait signal WAIT is outputted (FIG. 5(*n*)).

In order to switch the word lines WL, the arbiter 12 and burst control circuit 16 shown in FIG. 1 reactivate the once inactivated burst signal BSTZ and active signal ACTZ (FIG. 5(*o*)). Then, the burst read operation of the memory cells MC connected to the word lines WL selected anew is carried out.

Figure 6:
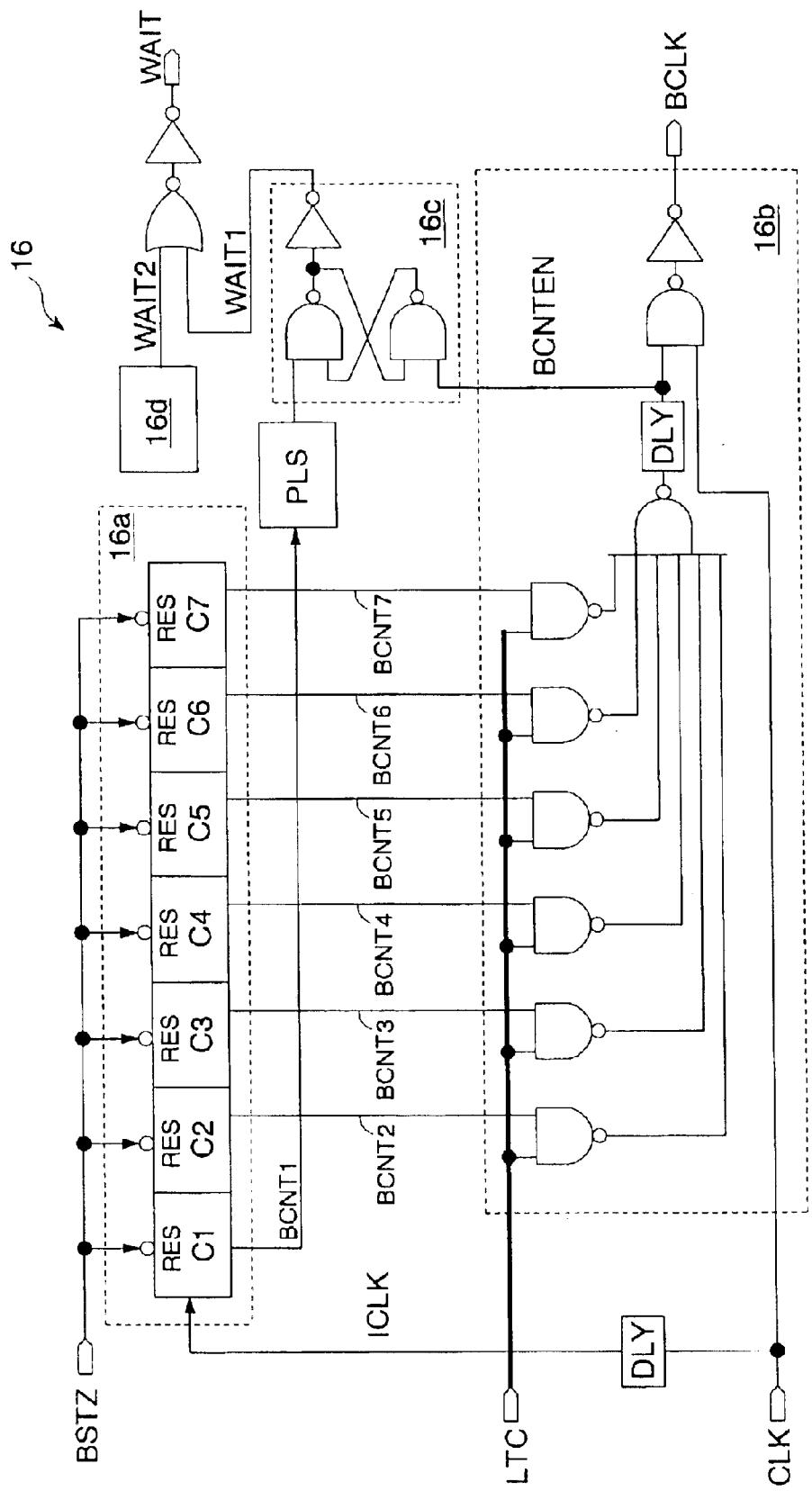
FIG. 6 is a block diagram showing the details of the burst control circuit of FIG. 1.

FIG. 6 shows the details of the burst control circuit 16 shown in FIG. 1.

The burst control circuit 16 has a seven-bit shift register 16*a*; a combinational circuit 16*b* for outputting the burst clock signal BCLK a number of times that is in accordance with the burst length BL; a flip-flop circuit 16*c* for outputting a wait signal WAIT1 that continues until the burst clock signals BCLK are outputted; and a wait control circuit 16*d*. Labels "DLY" and "PLS" in FIG. 6 designate a delay circuit, another delay circuit and a pulse generator, respectively.

The wait control circuit 16*d* outputs a wait signal WAIT2 when no data are inputted to or outputted from the data input/output terminals DQ during the burst access operation. For example, the wait signal WAIT2 is outputted when the selections of the word lines WL are switched during the full burst operation. The wait signal WAIT outputted to the wait terminal is the OR logic of the wait signals WAIT1 and WAIT2.

Figure 7:
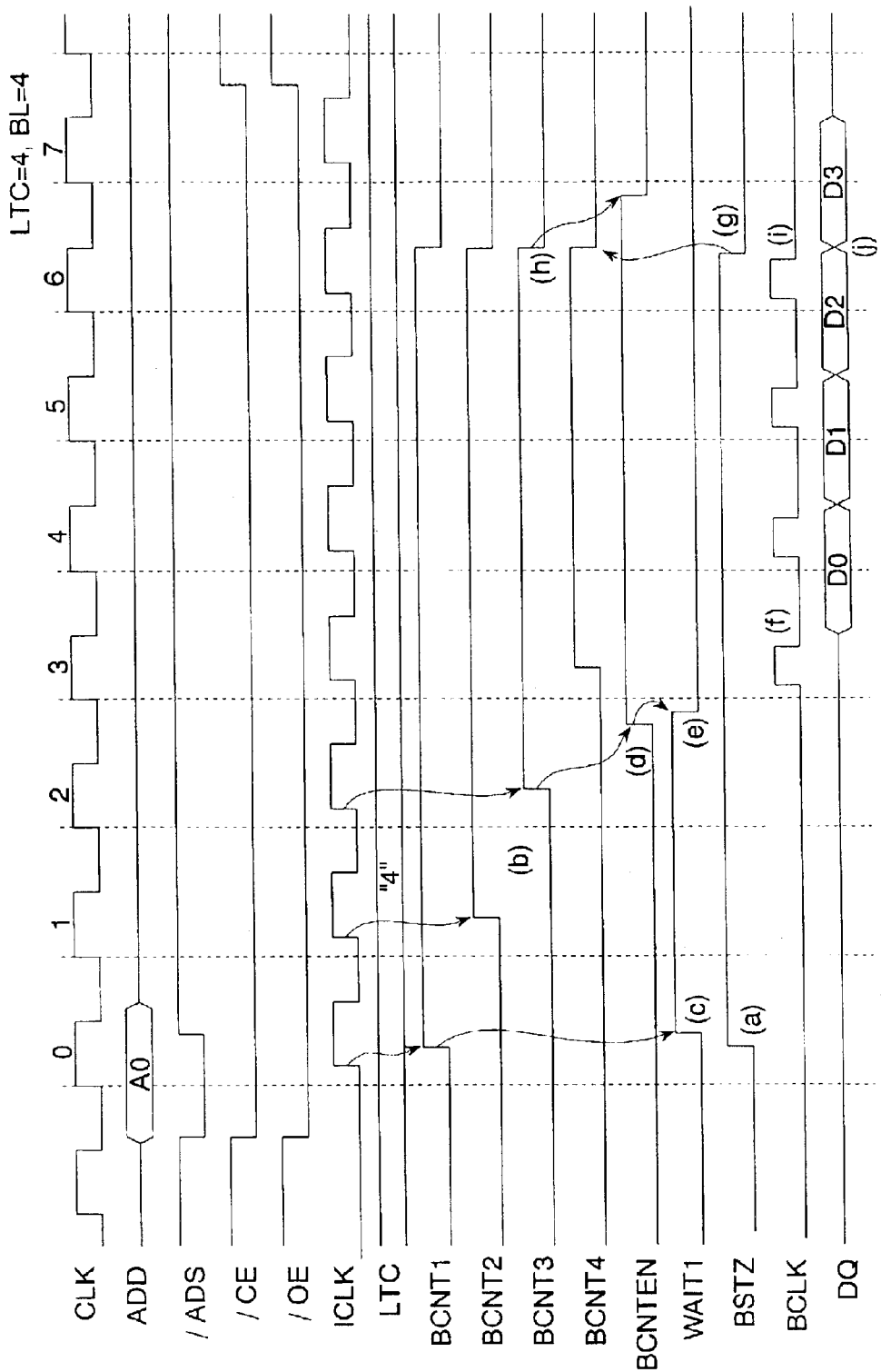
FIG. 7 is a timing diagram showing an operation of the burst control circuit of FIG. 6.

FIG. 7 shows an operation of the burst control circuit 16 shown in FIG. 6. In this example, a case where a latency is set to "4" in the mode register of the mode setting control circuit 18 shown in FIG. 1 will be described hereafter. Now, in this case, referring to FIG. 6, out of the NAND gates that receive an LTC signal, only the NAND gate that receives a count signal BCNT3 is operating as an inverting circuit, while the other NAND gates are outputting high levels.

Firstly, an access command (in this example, a read command because of the low level of the /OE signal) is supplied, and the burst control circuit 16 shown in FIG. 1 causes the burst signal BSTZ to change to a high level (FIG. 7(*a*)). The high level of the burst signal BSTZ cancels the resetting of the shift register 16*a*. The shift register 16*a* causes, in synchronization with external clock signals CLK, count signals BCNT1–4 to sequentially change to high levels (FIG. 7(*b*)).

The flip-flop circuit 16*c* is set in synchronization with the rising edge of the count signal BCNT1, and the wait signal WAIT1 changes to a high level (FIG. 7(*c*)).

An enable signal BCNTEN changes to a high level in synchronization with the rising edge of the count signal BCNT3 (FIG. 7(*d*)). The flip-flop circuit 16*c* is reset by the high level of the enable signal BCNTEN, and the wait signal WAIT1 changes to a low level (FIG. 7(*e*)).

The high level of the enable signal BCNTEN causes the burst clock signals BCLK to be outputted in synchronization with external clock signals CLK (FIG. 7(*f*)). The burst clock signal BCLK (strobe signal) is outputted a number of times that corresponds to the burst length BL set in the mode register. Then, read data are outputted to the data input/output terminals DQ in synchronization with the burst clock signals BCLK.

The burst control circuit 16 causes, in synchronization with the sixth external clock signal CLK, the burst signal BSTZ to change to a low level (FIG. 7(g)). That is, the burst signal BSTZ is outputted in accordance with the period during which the burst clock signals BCLK are outputted. The low level of the burst signal BSTZ resets the shift register 16a, causing the count signals BCNT1–4 to change to low levels (FIG. 7(h)).

The low level of the count signal BCNT3 causes the enable signal BCNTEN to change to a low level, which causes the outputting of the burst clock signals BCLK to be stopped (FIG. 7(i)). Consequently, the outputting of read data is started in accordance with the latency LTC set in the mode register, and the read data are outputted a number of times that corresponds to the burst length BL (FIG. 7(j)).

Figure 8:
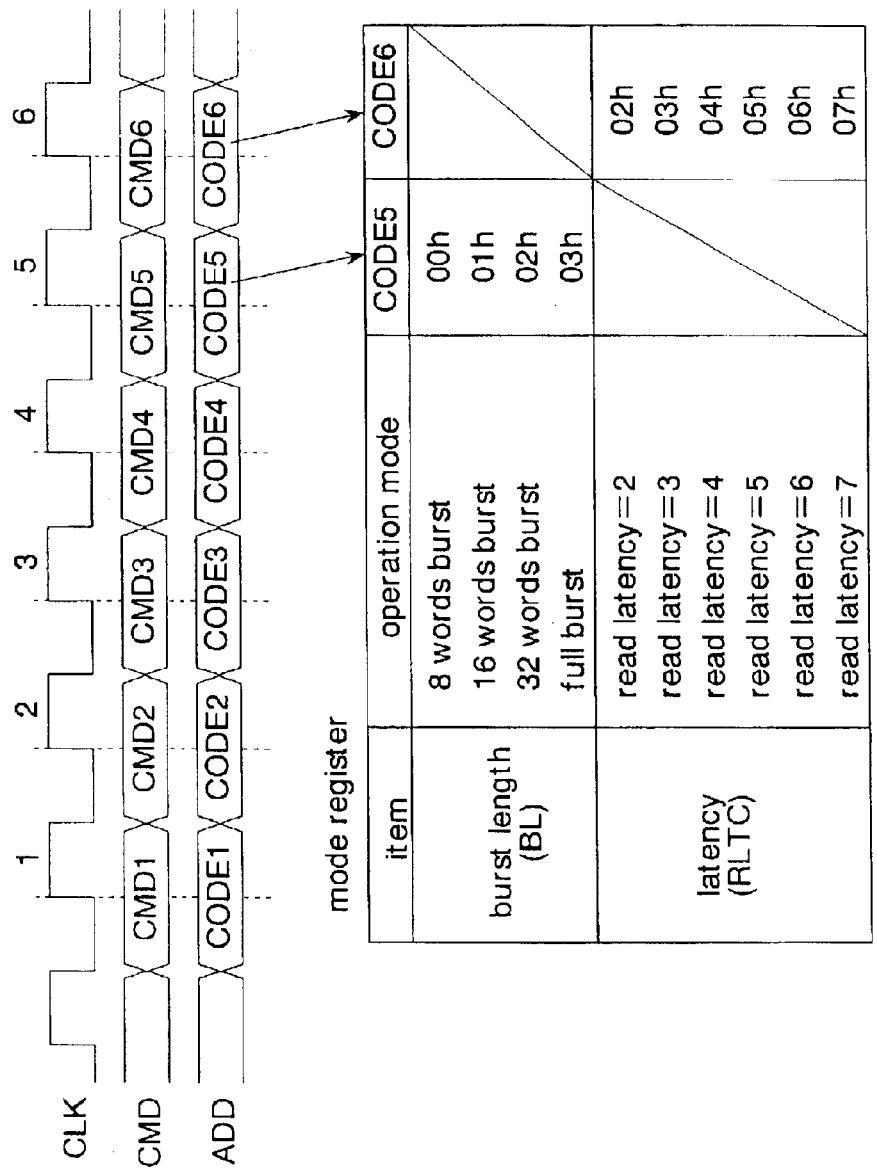
FIG. 8 is an explanatory diagram showing a setting method of the mode register of FIG. 1.

FIG. 8 shows a setting method of the mode register in the mode setting control circuit 18 shown in FIG. 1.

The setting of the mode register is made by successively, four times, supplying thereto a predetermined command CMD (CMD1, CMD2, CMD3, CMD4) and a predetermined address ADD (CODE1, CODE2, CODE3, CODE4) and thereafter supplying predetermined codes CODE5 and CODE6 to the address terminals. The burst length BL is set in accordance with the code CODE5, and the latency LTC is set in accordance with the code CODE6. That is, the mode register receives the codes CODE5 and CODE6 as set signals for setting the operation mode. For example, the operation mode is set to an eight-word burst mode when the code CODE5 is hexadecimal 0; while it is set to a full burst mode when the code CODE5 is hexadecimal 3.

Figure 9:
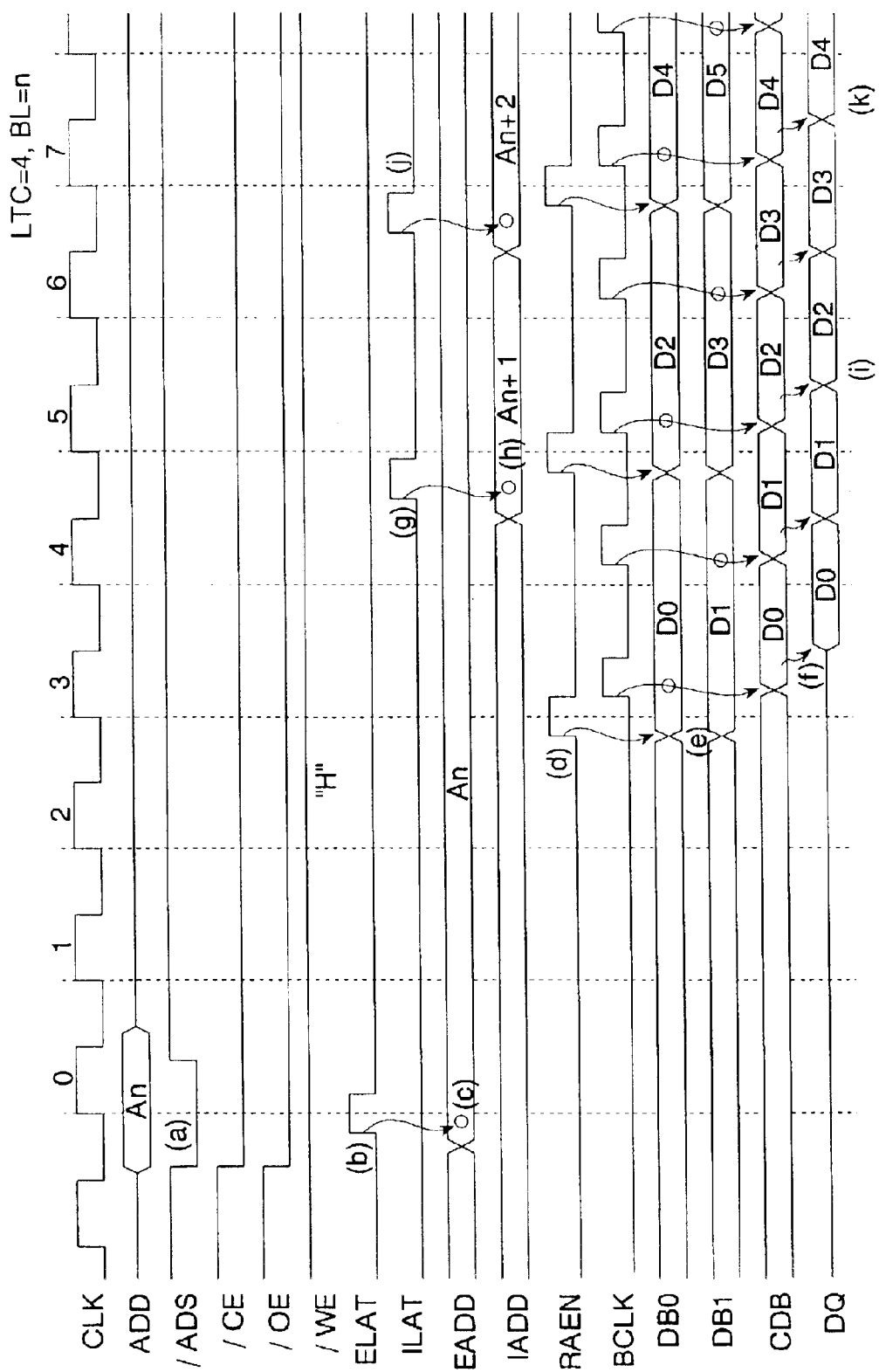
FIG. 9 is a timing diagram showing a burst read operation in the first embodiment.

FIG. 9 shows a read operation during the full burst mode in the pseudo SRAM described above.

Firstly, an address signal ADD (An) and /ADS, /CE and /OE signals are supplied in synchronization with the rising edge of the zeroth CLK signal (FIG. 9(a)). The timing control circuit 22 shown in FIG. 1 outputs an address latch signal ELAT for latching the address signal ADD supplied from the exterior (FIG. 9(b)). The address latch 24 latches the address signal ADD (An) in synchronization with the address latch signal ELAT (FIG. 9(c)).

Next, the timing control circuit 22 outputs a read amplifier enable signal RAEN (FIG. 9(d)). The read amplifier enable signal RAEN activates the read/write amplifier 30, causing parallel read data D0 and D1 to be outputted to the data buses DB0 and DB1 (FIG. 9(e)). The parallel read data D0 and D1 are converted into serial data by the data registers of the burst transfer register 32 in synchronization with the burst clock signals BCLK, and then sequentially outputted to the common data bus CDB. Then, the read data D0 and D1 are outputted from the data input/output terminals DQ in synchronization with clock signals CLK (FIG. 9(f)).

Next, the timing control circuit 22 outputs an address latch signal ILAT (FIG. 9(g)). The address latch 24 latches the internal address signal IADD (An+1) in synchronization with the address latch signal ILAT (FIG. 9(h)). Then, in a similar manner to the above, read data D2 and D3 corresponding to the internal address signal IADD are outputted (FIG. 9(i)).

Thereafter, the timing control circuit 22 sequentially outputs address latch signals ILAT (FIG. 9(j)), and read data are sequentially outputted in accordance with the internal address signal IADD generated by the burst address counter 20 (FIG. 9(k)).

Figure 10:
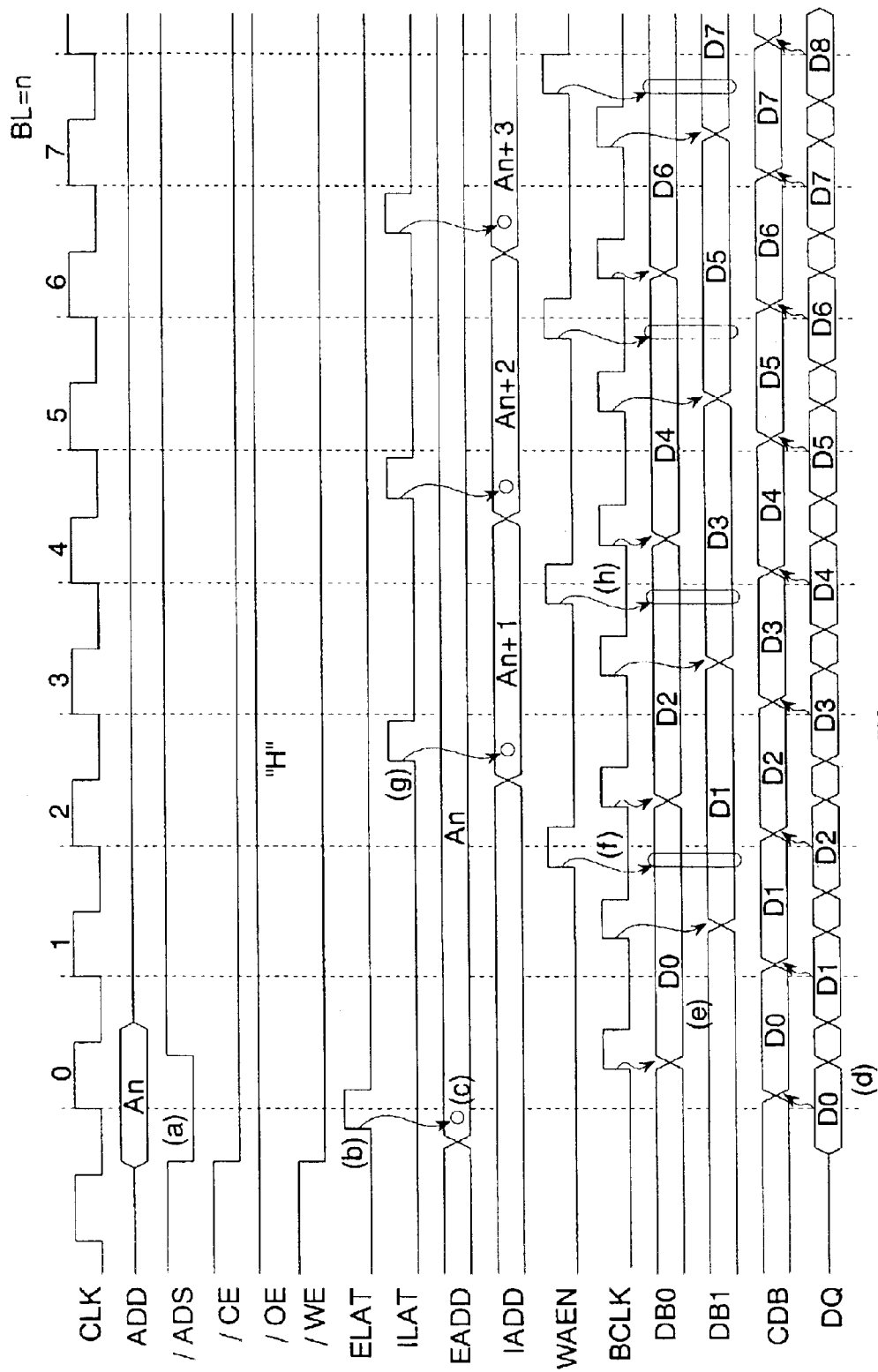
FIG. 10 is a timing diagram showing a burst write operation in the first embodiment.

FIG. 10 shows a write operation during the full burst mode in the pseudo SRAM described above.

Firstly, an address signal ADD (An) and /ADS, /CE and /WE signals are supplied in synchronization with the rising edge of the zeroth CLK signal (FIG. 10(a)). The timing control circuit 22 shown in FIG. 1 outputs an address latch signal ELAT for latching the address signal ADD supplied from the exterior (FIG. 10(b)). The address latch 24 latches the address signal ADD (An) in synchronization with the address latch signal ELAT (FIG. 10(c)).

In the write operation, write data are sequentially supplied in synchronization with the respective rising edges of CLK signals in such a manner that this sequential supply of write data starts in synchronization with the rising edge of the CLK signal at which the access command is received (FIG. 10(d)). The data registers of the burst transfer register 32 sequentially hold the write data from the common data bus CDB in synchronization with the burst clock signals BCLK, and transfers the held data to the data buses DB0 and DB1. That is, the serial write data on the common data bus CDB are converted into parallel write data (FIG. 10(e)).

The read/write amplifier 30 writes, in synchronization with a write amplifier enable signal WAEN, the write data supplied from the data buses DB0 and DB1 into the memory cell array 28 (FIG. 10(f)).

Thereafter, similarly to FIG. 9, an internal address signal IADD is latched in synchronization with an address latch signal ILAT (FIG. 10(g)). Then, write data D3, D4, D5 and others are sequentially written into the memory cells MC corresponding to the internal address signal IADD (FIG. 10(h)).

Figure 11:
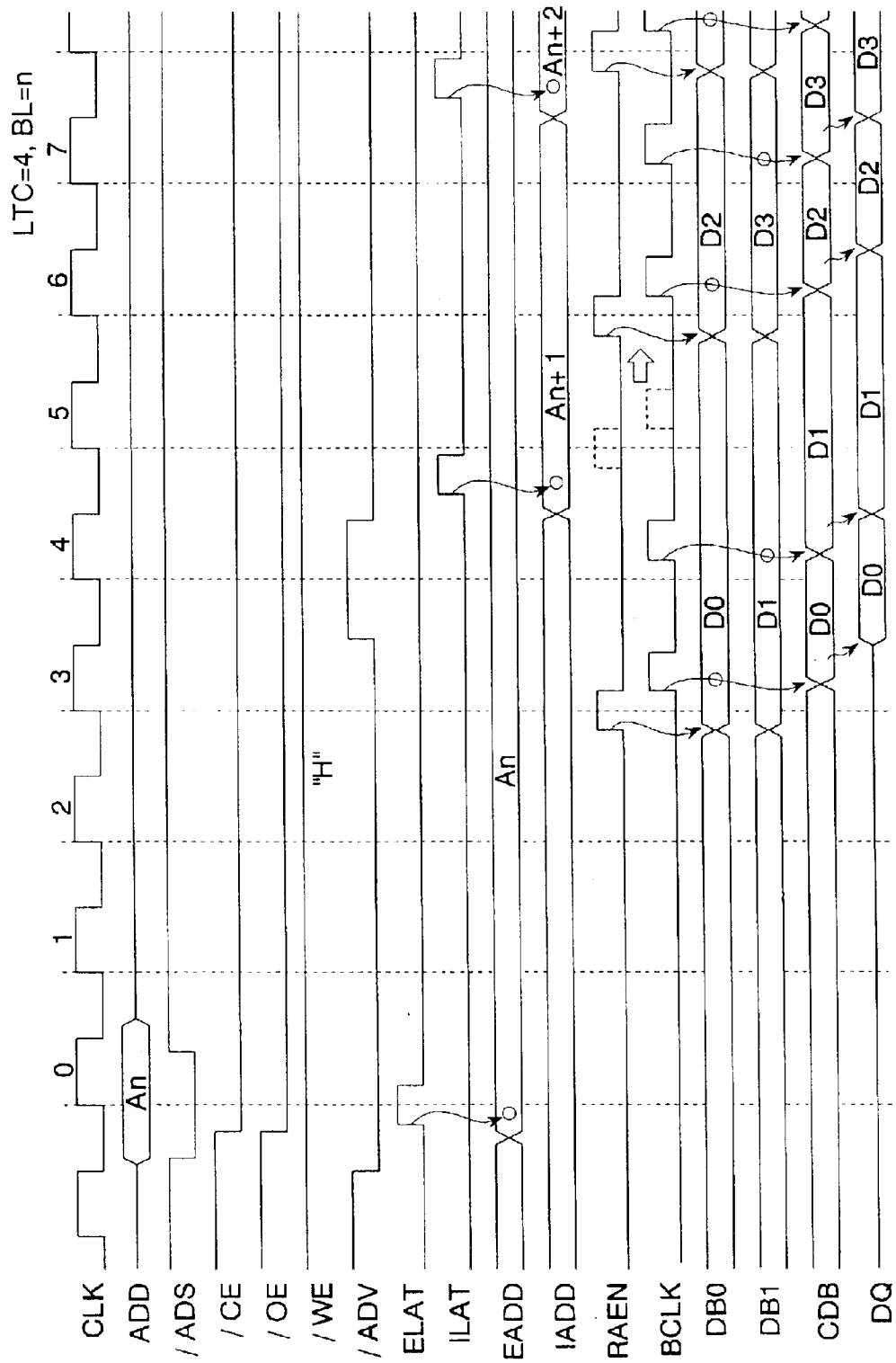
FIG. 11 is a timing diagram showing the function of /ADV signal.

FIG. 11 shows the function of the burst address advance signal /ADV.

The /ADV signal is supplied so as to temporarily stop a burst access operation and maintain the outputting of read data. For example, if a high level of the /ADV signal is supplied in synchronization with the rising edge of the fourth clock signal CLK, the burst access operation is temporarily stopped, and read data D1 outputted in synchronization with the next clock cycle is maintained not only at the fourth clock cycle but also at the fifth clock cycle. That is, the supply of the /ADV signal causes the internal operation of the pseudo SRAM to be shifted one clock cycle later.

Figure 12:
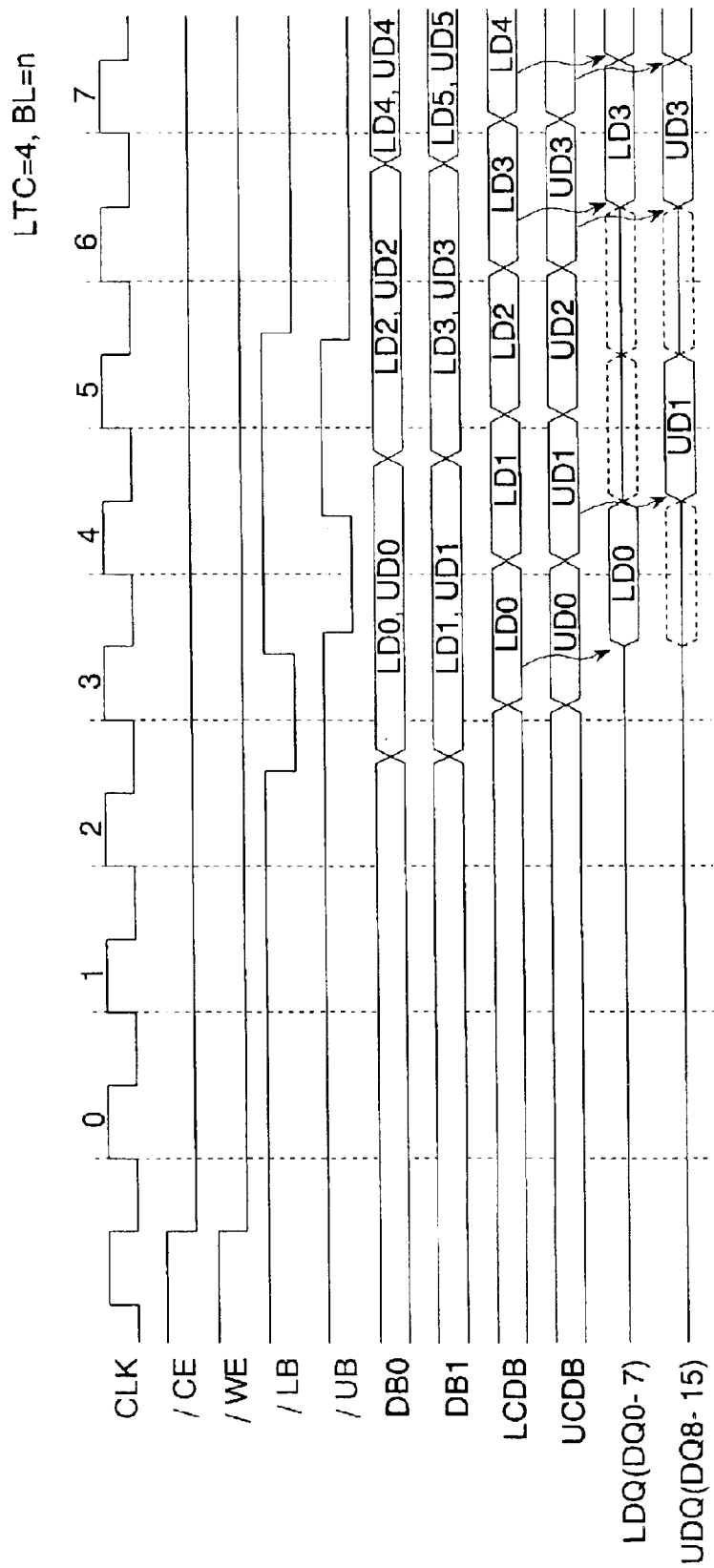
FIG. 12 is a timing diagram showing the functions of /LB and /UB signals in the burst read operation.

FIG. 12 shows the functions of the lower byte signal /LB and upper byte signal /UB during a burst read operation. In the figure, for better understanding, the common data bus CDB is described as separate buses: LCDB corresponding to the /LB signal and UCDB corresponding to the /UB signal.

The /LB signal is a signal that is supplied so as to validate lower eight bits of data, while the /UB signal is a signal that is supplied so as to validate upper eight bits of the data. According to this embodiment, in the read operation, if a high level of the /LB signal (or /UB signal) is supplied in synchronization with the rising edge of a clock signal CLK, the read data to be outputted in synchronization with the next clock cycle is inhibited from being outputted. That is, the output buffers in the data output control circuit 34 shown in FIG. 1 are inactivated, thereby causing the data input/output terminals DQ to go into a high impedance state.

Figure 13:
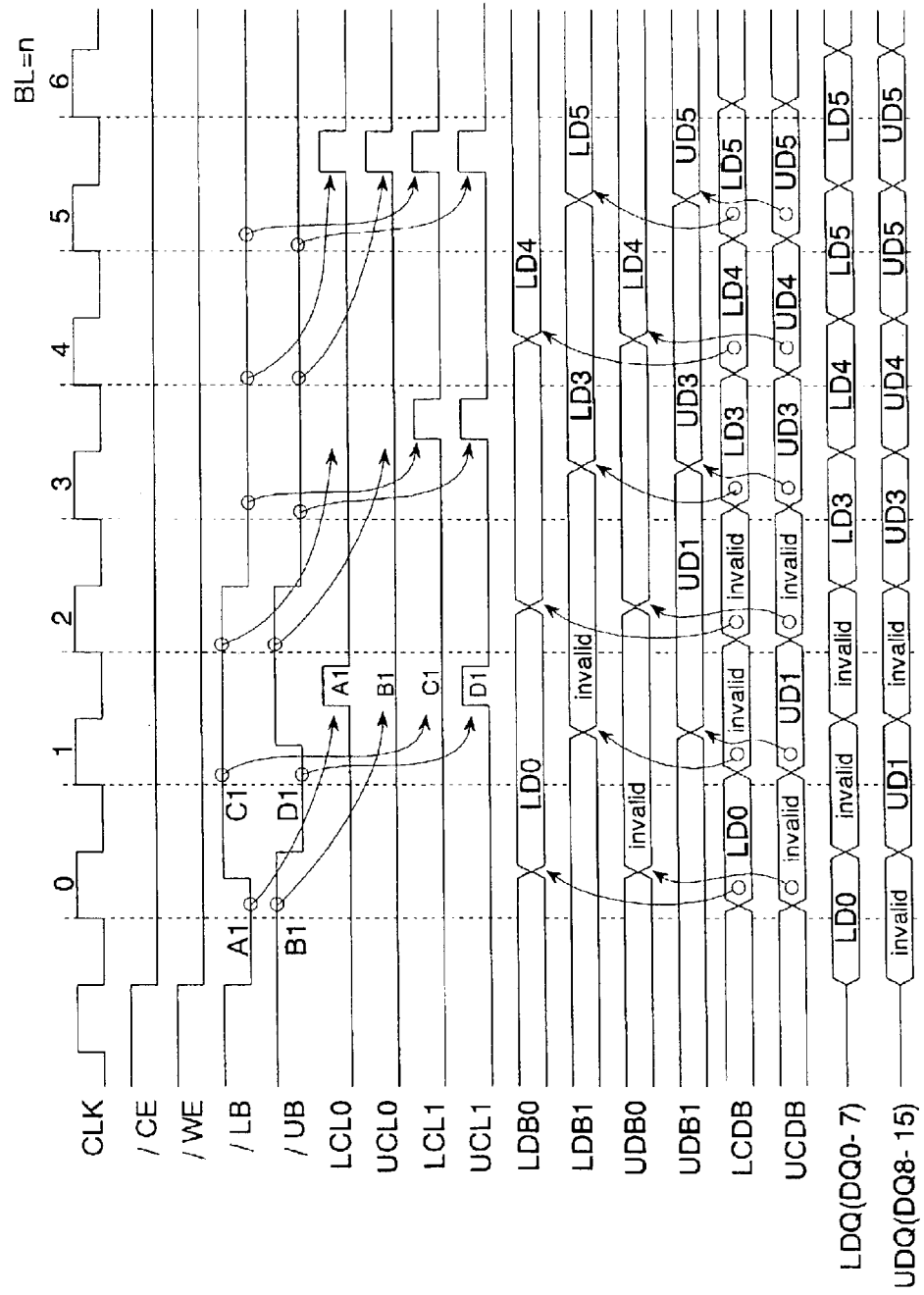
FIG. 13 is a timing diagram showing the functions of /LB and /UB signals in the burst write operation.

FIG. 13 shows the functions of the lower byte signal /LB and upper byte signal /UB during a burst write operation. In this figure, too, for better understanding, the common data bus CDB is described as separate buses: LCDB corresponding to the /LB signal and UCDB corresponding to the /UB signal. Also, for better understanding, the data bus DB0 is described as separate buses: LDB0 corresponding to the /LB signal and UDB0 corresponding to the /UB signal. Similarly, the data bus DB1 is described as separate buses: LDB1 corresponding to the /LB signal and UDB1 corresponding to the /UB signal.

According to this embodiment, in the write operation, if a high level of the /LB signal (or /UB signal) is supplied in synchronization with the rising edge of a clock signal CLK, the write data being supplied in synchronization with this clock signal CLK is invalidated. More particularly, when the /LB signal (or /UB signal) exhibits a high level, the corresponding column selecting signals CL (LCL0, UCL0, LCL1, UCL1) are not outputted, so that the column switches SW are not turned on. Therefore, the write data corresponding to the high level of the /LB signal (or /UB signal) are not written into the memory cells MC.

For example, the /UB signal in synchronization with the zeroth clock signal CLK exhibits a high level (B1). The /LB signal in synchronization with the first clock signal CLK exhibits a high level (C1). Accordingly, the corresponding column selecting signals UCL0 and LCL1 are not outputted, and the write data transferred to the data buses LDB1 and UDB0 are not written into the memory cells MC.

In the first embodiment described above, when the refresh request signal REFZ and the supply of an access command conflict with each other, the arbiter 12 determines which of the refresh operation or the burst access operation is to be performed first. Therefore, in the pseudo SRAM, the refresh and burst access operations can be sequentially executed without being overlapped. Since the burst access operation can be executed without confliction with the refresh operation, the read data can be outputted at a high speed, and the write data can be inputted at a high speed. That is, the data transfer rate can be improved.

In the arbiter 12 formed is the refresh holding part 12b for holding the refresh request signal REFZ during the burst access operation. Therefore, when the burst access operation is executed prior to the refresh operation, the refresh request signal REFZ can be prevented from being lost. Also formed in the arbiter 12 is the access holding part 12d for holding an access command during the refresh operation. Therefore, when the refresh operation is executed prior to the burst access operation, the access request can be prevented from being lost.

The refresh holding part 12b outputs the refresh starting signals REFS1 and REFS2 in response to the completion of the outputting of the burst signal BSTZ. Therefore, when the burst access operation is executed first, the time from the burst access operation to the starting of the refresh operation can be shortened. As a result, the next access command can be supplied earlier, and hence the data transfer rate can be improved.

The refresh holding part 12b also outputs the refresh starting signals REFS1 and REFS2 without waiting for the completion of the outputting of the read data from the burst transfer register 32. Therefore, the refresh operation can be started during the burst operation, and hence the data transfer rate can be further improved.

During the full burst operation, the refresh holding part 12b outputs the refresh starting signals REFS1 and REFS2 when the selections of the word lines WL are switched. Executing the refresh operation while the burst operation is interrupted (at the time of switching the word lines WL) can minimize the effect of the refresh operation that interferes with external accesses. As a result, even when the refresh operation is inserted into the full burst operation, the data transfer rate can be prevented from being degraded.

The burst address counter 20 sequentially generates, in response to the address signal ADD supplied in accordance with the access command, the internal address signals IADD necessary for the burst operation. Generating within the pseudo SRAM the address signals necessary for the burst operation can reduce the effect of skew of the address signals. Accordingly, the operation cycle can be shortened independently of the address skew, and hence the data transfer rate can be further improved.

There is formed the wait terminal for outputting the wait signal WAIT indicative of invalidity of the data input/output terminals DQ. Therefore, the system incorporating the pseudo SRAM can access, in accordance with the wait signal WAIT, the pseudo SRAM with an optimum timing. For example, the CPU and the like for managing the system can access a different device during the outputting of the wait signal WAIT. As a result, the utilization ratio of the system buses can be improved.

The inputting of the write data and the outputting of the read data are masked in accordance with the /UB and /LB signals. Therefore, even when the bit width of data signals DQ is large, the system incorporating the pseudo SRAM can efficiently write and read the data signals DQ.

During the write operation, the write data is masked by turning off column switches that operate at a relatively late timing. Therefore, the mask control of the write data can be easily performed.

The mode setting control circuit 18 receives the signals of predetermined logic values at the address and command terminals four times successively, and then receives, as the set signals for setting the read latency LTC and burst length BL, the signals CODE5 and CODE6 supplied to the address terminals. This eliminates the necessity to provide any dedicated terminals for setting the operation mode.

During the burst operation, the memory cell array 28 is inactivated after the read data are transferred to the data registers of the burst transfer register 32. The quick inactivation of the memory cell array 28 during the burst read operation allows an operation responsive to a refresh request or the next access request to be started earlier. As a result, the data transfer rate can be improved.

Figure 14:
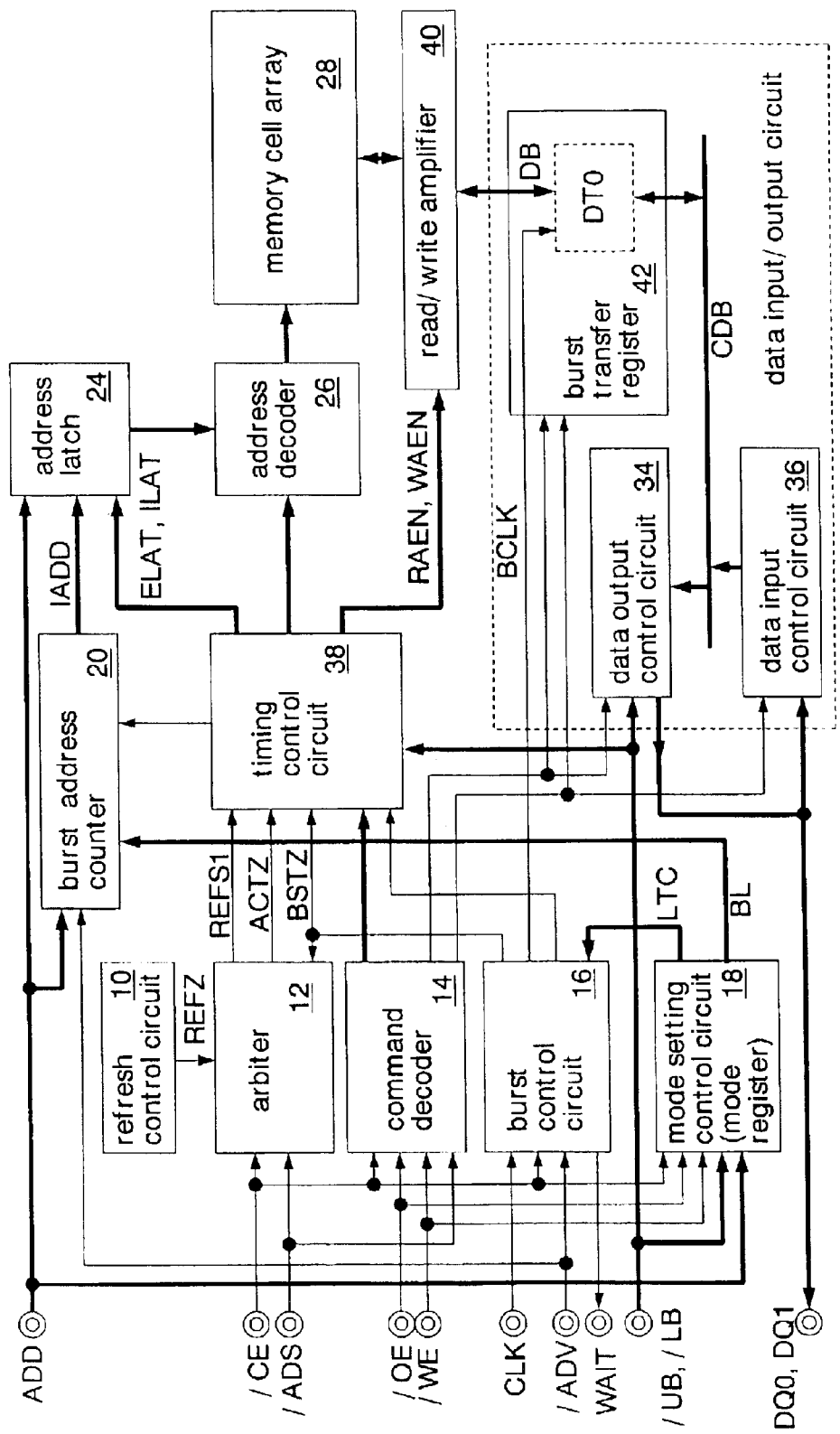
FIG. 14 is a block diagram showing a second embodiment of the present invention.

FIG. 14 shows a second embodiment of semiconductor memory according to the present invention. In this embodiment, elements corresponding to the same elements in the first embodiment are identified by the same reference designations, and their detailed descriptions are omitted.

According to the present embodiment, a timing control circuit 38, a read/write amplifier 40 and a burst transfer register 42 are formed in place of the timing control circuit 22, read/write amplifier 30 and burst transfer register 32 of the first embodiment, respectively. A data bus DB connecting the read/write amplifier 40 to the burst transfer register 42 has the same bit width as the common data bus CDB. The other structures of the present embodiment are the same as those of the first embodiment.

During a burst operation, the timing control circuit 38 outputs read amplifier enable signals RAEN or write amplifier enable signals WAEN in synchronization with the respective rising edges of clock signals CLK. The burst transfer register 42 directly transfers read data supplied from the read/write amplifier 40 to the data output control circuit 34 via the common data bus CDB. That is, the read data are not subjected to the parallel-serial conversion. The burst transfer register 42 directly outputs write data supplied from the data input control circuit 36 to the read/write amplifier 40 via the data bus DB. That is, the write data are not subjected to the serial-parallel conversion.

Figure 15:
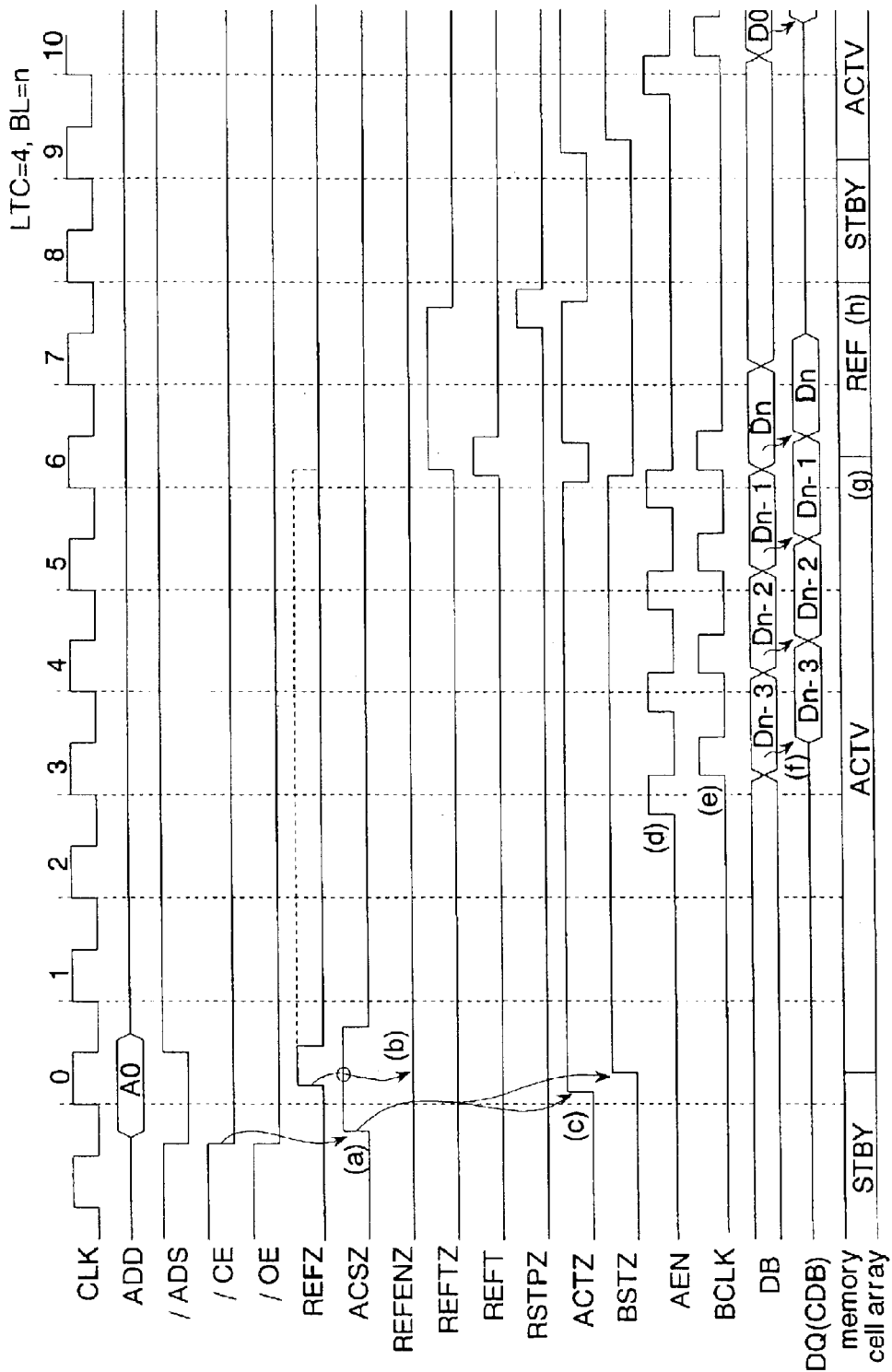
FIG. 15 is a timing diagram showing a burst read operation in the second embodiment.

FIG. 15 shows a full burst read operation of the pseudo SRAM shown in FIG. 14. Detailed descriptions of operations corresponding to the same operations of the first embodiment (FIG. 5) are omitted.

In FIG. 15, a refresh request occurs immediately after an access command is received. That is, a refresh operation is executed after a read operation. In this example, the read latency LTC is set to "4".

Firstly, a read command is supplied in synchronization with the rising edge of the zeroth CLK signal, and the arbiter 12 shown in FIG. 2 outputs an access signal ACSZ (FIG. 15(a)). The refresh judging part 12a of the arbiter 12 receives a refresh request signal REFZ after the read command is supplied. Accordingly, a refresh enable signal REFENZ is held at a low level (FIG. 15(b)). The command generating part 12c outputs an active signal ACTZ in response to the access signal ACSZ (FIG. 15(c)). The active signal ACTZ's tuning to a high level causes the memory cell array 28 to shift from a standby state STBY to an active state ACTV.

Next, a burst signal BSTZ changes to a high level, and a wait signal WAIT exhibits a high level for a predetermined time. The timing control circuit 38 outputs read amplifier enable signals RAEN in synchronization with the respective rising edges of the third through sixth clock signals CLK (FIG. 15(d)). The burst control circuit 16 outputs burst clock signals BCLK in synchronization with the respective rising edges of the third through sixth clock signals CLK (FIG. 15(e)). Then, the read operation is executed, and read data Dn−3, Dn−2, Dn−1 and Dn are sequentially outputted to the data bus DB (FIG. 15(f)).

In the present embodiment, the read/write amplifier 40 outputs the read data Dn−3, Dn−2, Dn−1 and Dn in accordance with the respective clock signals CLK. Accordingly, the memory cell array 28 must operate until the fourth read data Dn is transferred to the read/write amplifier 40. Therefore, the length of the period of the active state ACTV is one clock cycle longer than in the first embodiment (FIG. 5) (FIG. 15(g)).

After a completion of the read operation, the refresh operation is executed (FIG. 15(h)). The refresh operation is executed one clock cycle later than in the first embodiment (FIG. 5). Accordingly, the next read operation in the full burst operation also starts one clock cycle later. Therefore, the data transfer rate is lower than in the first embodiment (FIG. 5).

However, executing, while enabling the burst operation in the pseudo SRAM, the refresh operation between the read operations in the burst operation can provide a higher data transfer rate than the prior art.

The present embodiment can provide similar effects to the foregoing first embodiment.

Figure 16:
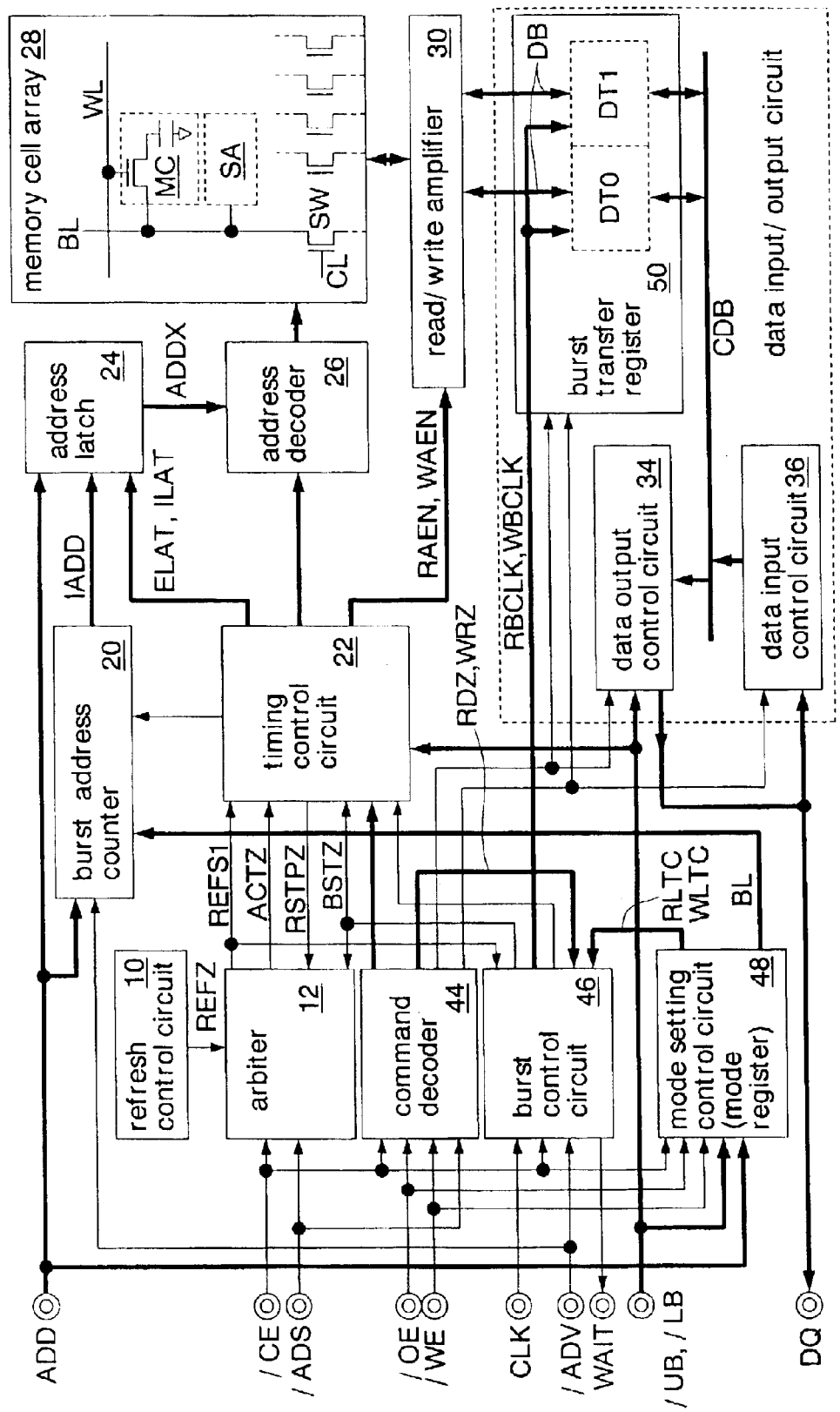
FIG. 16 is a block diagram showing a third embodiment of the present invention.

FIG. 16 shows a third embodiment of semiconductor memory according to the present invention. In this embodiment, elements corresponding to the same elements in the first embodiment are identified by the same reference designations, and their detailed descriptions are omitted.

According to the present embodiment, a command decoder 44, a burst control circuit 46 (first burst control circuit), a mode setting control circuit 48 and a burst transfer register 50 are formed in place of the command decoder 14, burst control circuit 16, mode setting control circuit 18 and burst transfer register 32 of the first embodiment, respectively. The other structures of the present embodiment are the same as those of the first embodiment.

The command decoder 44, when receiving a read or write command via the command terminal, outputs a read control signal RDZ or a write control signal WRZ, respectively. During a read operation, the burst control circuit 46 receives the read control signal RDZ, counts the clocks a number of times that is in accordance with a read latency signal RLTC, and thereafter outputs a read burst clock signal RBCLK a number of times that is in accordance with a burst length BL. During a write operation, the burst control circuit 46 receives the write control signal WRZ, counts the clocks a number of times that is in accordance with a write latency signal WLTC, and thereafter outputs a write burst clock signal WBCLK a number of times that is in accordance with a burst length BL.

The mode setting control circuit 48 has a mode register that can be set from the exterior. The burst length BL, read latency RLTC and write latency WLTC are set in the mode register. The values set in the mode register are outputted, as a burst length signal BL, a read latency signal RLTC and a write latency signal WLTC, to the burst control circuit 46 and burst address counter 20. The read latency RLTC is the number of clocks from a time point when a read command is supplied to a time point when the first data are outputted. More particularly, the read latency RLTC represents the number of clocks from the falling edge of a chip enable signal /CE to the outputting of the first data during the read operation.

The write latency WLTC is the number of clocks from a time point when a write command is supplied to a time point when the first data is inputted. More particularly, the write latency WLTC represents the number of clocks from the falling edge of a chip enable signal /CE to the inputting of the first data during the write operation. Thus, the present embodiment is characterized in that the latencies for the read and write operations can be set independently of each other.

The burst transfer register 50 has a plurality of data registers (DT0, DT1 and so on) for holding data. The burst transfer register 50 converts parallel read data supplied from the read/write amplifier 30 into serial data, and outputs the converted serial data to the common data bus CDB in synchronization with the read burst clock signals RBCLK. Also, the burst transfer register 50 converts serial write data supplied from the common data bus CDB into parallel data, and outputs the converted parallel data to the read/write amplifier 30 in synchronization with the write burst clock signals WBCLK.

Figure 17:
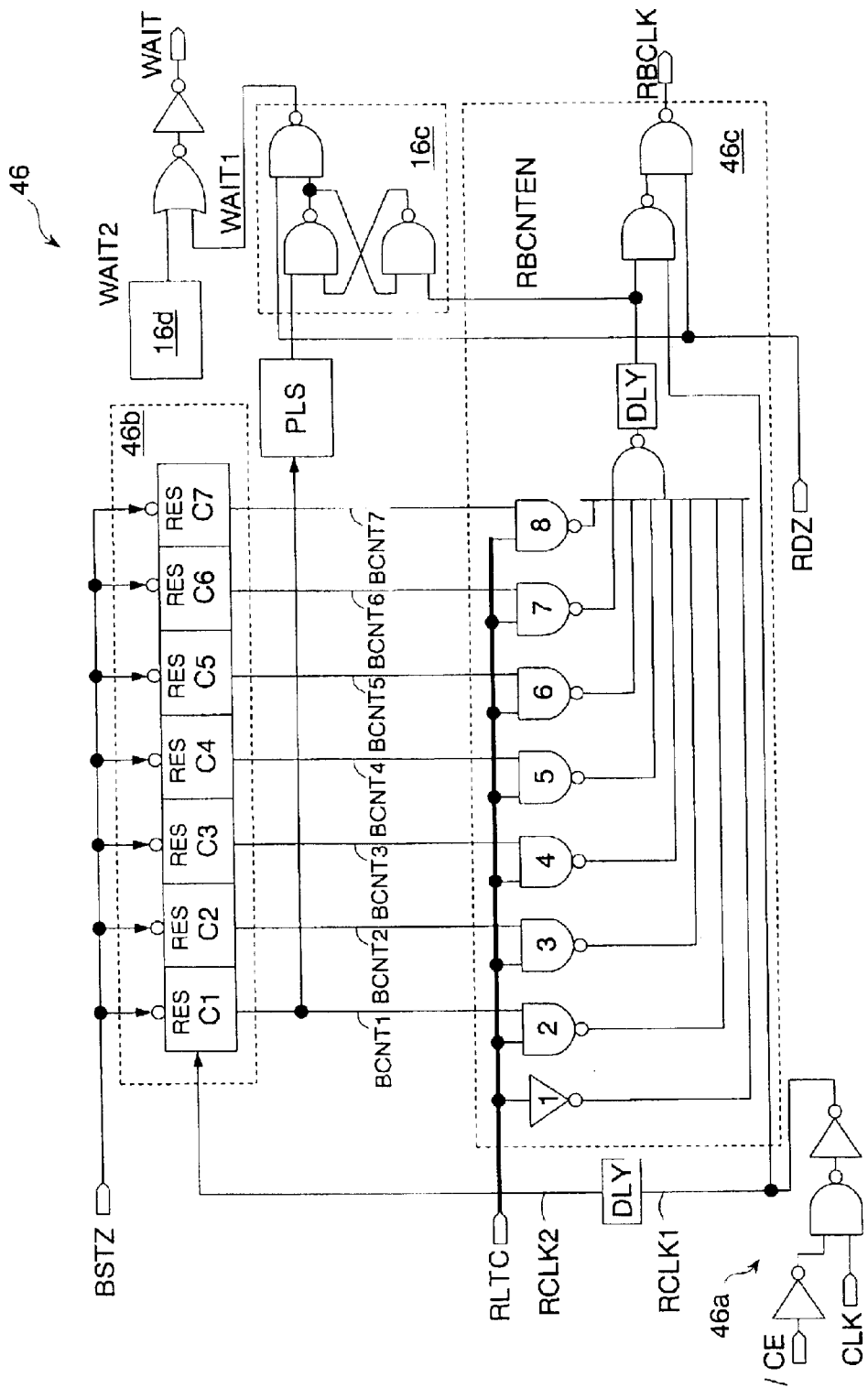
FIG. 17 is a block diagram showing essential portions of the burst control circuit of FIG. 16.
Figure 18:
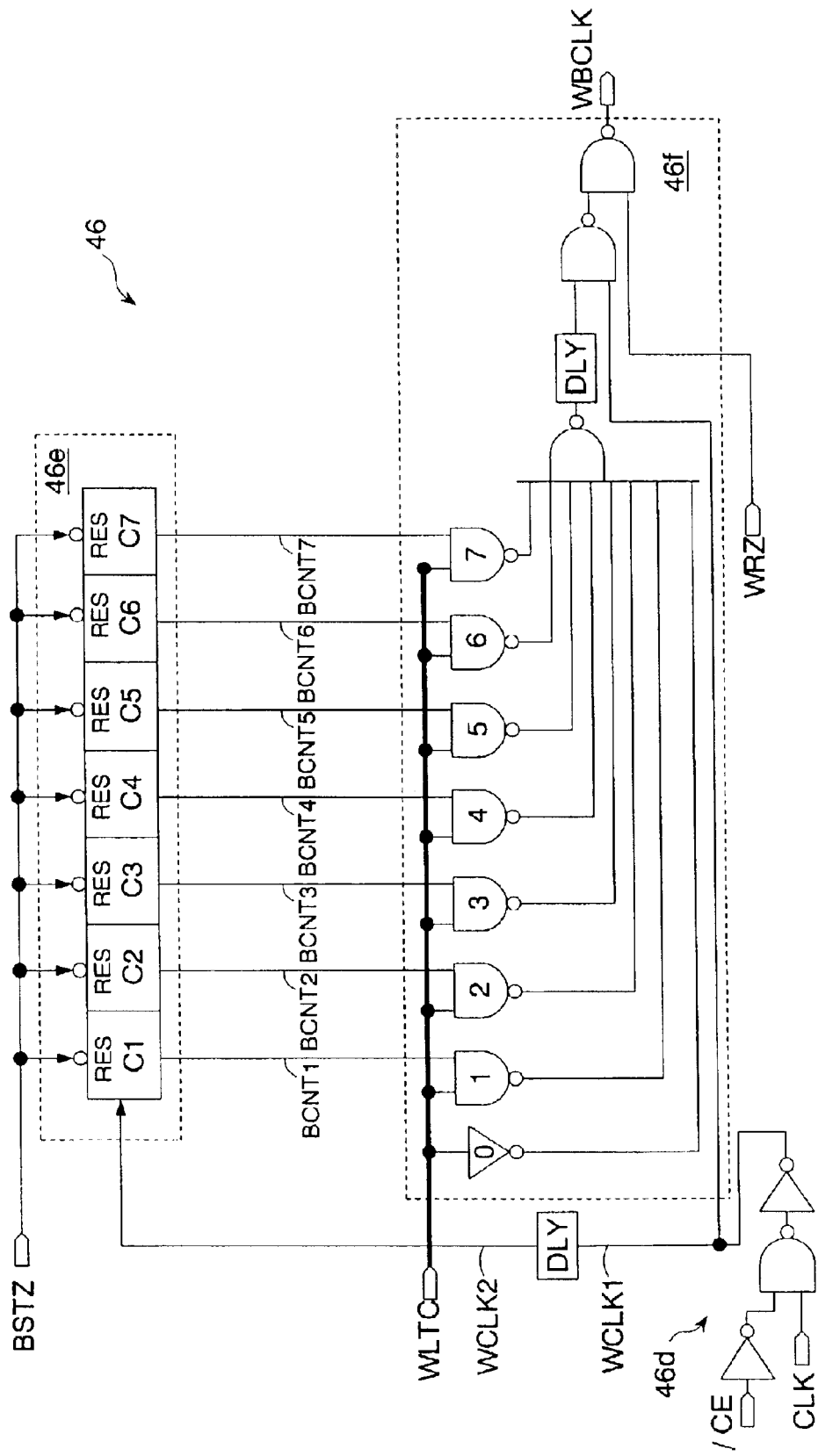
FIG. 18 is a block diagram showing the other essential portions of the burst control circuit of FIG. 16.

FIGS. 17 and 18 show the details of the burst control circuit 46 shown in FIG. 16. FIG. 17 shows a circuit portion of the burst control circuit 46 for generating read burst clock signals RBCLK and a wait signal WAIT during the read operation, while FIG. 18 shows a circuit portion of the burst control circuit 46 for generating write burst clock signals WBCLK during the write operation.

In FIG. 17, the burst control circuit 46 has a clock generating circuit 46a; a seven-bit shift register 46b; a combinational circuit 46c for outputting read burst clock signals RBCLK; a flip-flop circuit 16c for outputting a wait signal WAIT1; a wait control circuit 16d; delay circuits DLY; and a pulse generating circuit PLS. The clock generating circuit 46a operates during the low level of a chip enable signal /CE, and outputs clock signals CLK as internal clock signals RCLK1. The clock generating circuit 46a operates as a level detecting circuit for detecting that the chip enable signal /CE (a command signal) supplied as an access command changes to its active level (low level).

The shift register 46b and combinational circuit 46c are approximately the same as the shift register 16a and combinational circuit 16b (FIG. 6) of the first embodiment. Therefore, the basic operations of the shift register 46b and combinational circuit 46c are the same as those of the corresponding circuits of the first embodiment (FIG. 7). The numbers indicated in the symbols of an inverter and two-input NAND gates of the combinational circuit 46c correspond to the values of the read latency RLTC. For example, when the read latency RLTC is set to "4", only the NAND gate numbered "4" is activated.

When an output enable signal /OE exhibits a low level (that is, when a RDZ signal exhibits a high level), the combinational circuit 46c outputs the read burst clock signal RBCLK, later by the number of clocks corresponding to a read latency RLTC than the supply of a chip enable signal /CE (the supply of a read command), the number of times that is in accordance with a burst length BL. That is, the shift register 46b and combinational circuit 46c operate together as an output control circuit that starts the outputting of the read burst clock signals RBCLK after measuring a predetermined time from when the chip enable signal /CE and output enable signal /OE change to their active levels.

The circuit for generating the wait signal WAIT is the same as in the first embodiment, and hence its description is omitted.

In FIG. 18, the burst control circuit 46 has a clock generating circuit 46d, a seven-bit shift register 46e, and a combinational circuit 46f for outputting write burst clock signals WBCLK. When a chip enable signal /CE exhibits a low level, the clock generating circuit 46d operates to output clock signals CLK as internal clock signals WCLK1. The clock generating circuit 46d operates as a level detecting circuit for detecting that the chip enable signal /CE (a command signal) supplied as an access command changes to its active level.

The shift register 46e and combinational circuit 46f are the same as the shift register 46b and combinational circuit 46c shown in FIG. 17. The numbers indicated in the symbols of the inverter and two-input NAND gates of the combinational circuit 46f correspond to the values of the write latency WLTC. For example, when the write latency WLTC is set to "4", only the NAND gate numbered "4" is activated.

When a write enable signal /WE exhibits a low level (that is, when a WRZ signal exhibits a high level), the combinational circuit 46f outputs the write burst clock signal WBCLK, later by the number of clocks corresponding to a write latency WLTC than the supply of the chip enable signal /CE (the supply of the write command), the number of times that is in accordance with a burst length BL. That is, the shift register 46e and combinational circuit 46f operate together as an output control circuit for starting the outputting of the write burst clock signals WBCLK after measuring a predetermined time from when the chip enable signal /CE changes to its active level. The basic operations of the shift register 46e and combinational circuit 46f are the same as those of the corresponding circuits of the first embodiment (FIG. 7).

The delay times of the delay circuits DLY1 and DLY2 of FIG. 18 are different from those of the delay circuits DLY1 and DLY2 of FIG. 17. That is, the predetermined times described above are different in length between the read and write operations. It, however, should be appreciated that the delay times of the delay circuits DLY1 and DLY2 of FIG. 18 may be set to the same values as those of the delay circuits DLY1 and DLY2 of FIG. 17 so that lengths of the predetermined time in the read and write operations described above may be the same.

Figure 19:
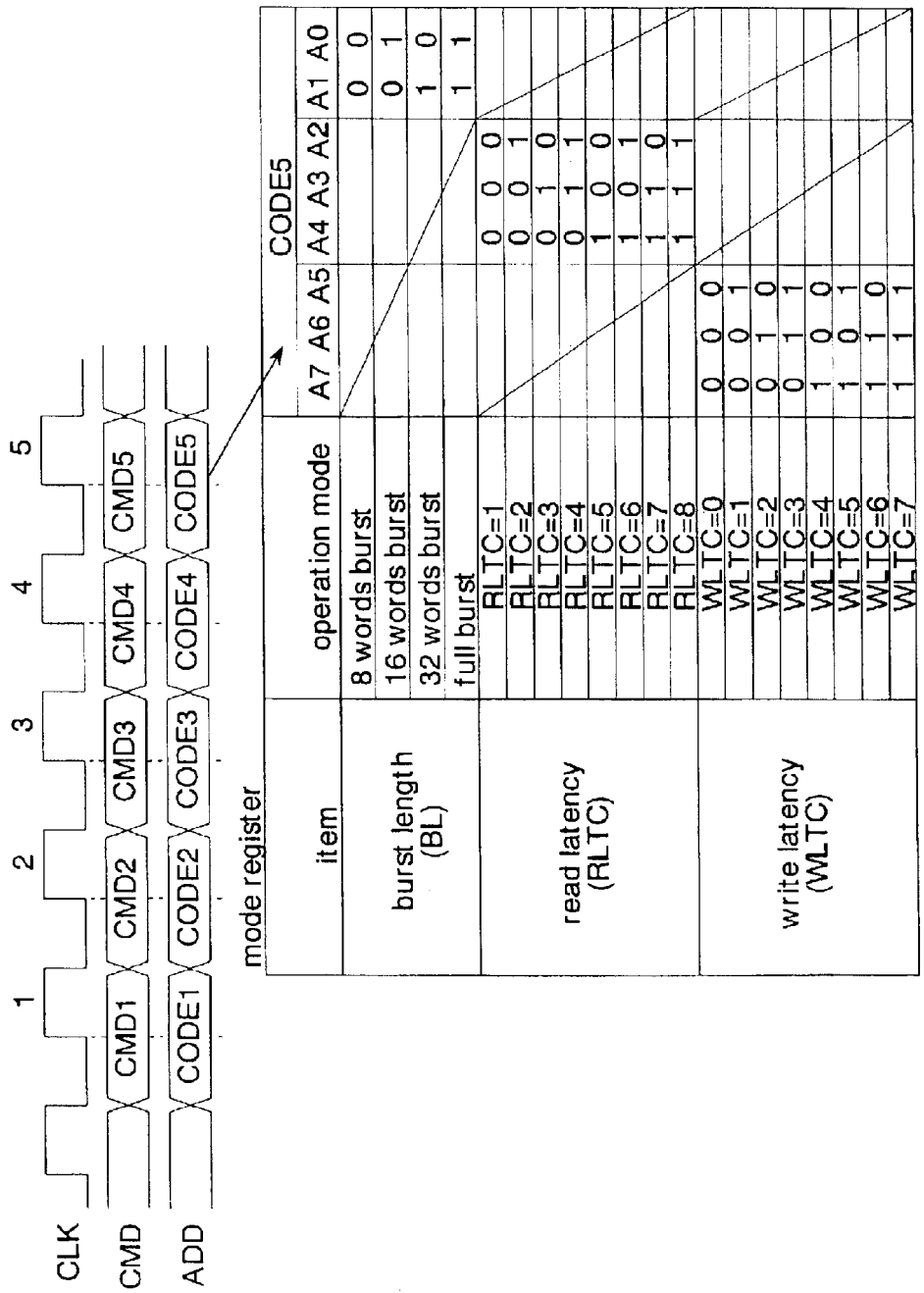
FIG. 19 is an explanatory diagram showing a setting method of the mode register of FIG. 16.

FIG. 19 shows a setting method of the mode register in the mode setting control circuit 48 shown in FIG. 16.

The mode register is set by successively, four times, supplying thereto a predetermined command CMD (CMD1, CMD2, CMD3, CMD4) and a predetermined address ADD (CODE1, CODE2, CODE3, CODE4) and thereafter supplying a predetermined code CODE5 to the address terminal. That is, the mode register receives the code CODE5 as a set signal for setting the operation mode. The number of the clock cycles for setting the mode register is one less than in the first embodiment.

In the present embodiment, out of one byte of address A7–A0 supplied as the code CODE5, lower two bits are used to set the burst length BL, the next three bits are used to set the read latency RLTC, and the upper three bits are used to set the write latency WLTC. The read latency RLTC may be set to any one of eight possible values: "1" through "8". The write latency WLTC also may be set to any one of eight possible values: "0" through "7". Thus, the latencies for the read and write operations can be set independently of each other. In other words, the burst control circuit 46 shown in FIG. 16 can generate, during the read and write operations, the burst clock signals RBCLK and WBCLK with mutually independent timings. As a result, the usability of the system incorporating the pseudo SRAM can be improved.

Figure 20:
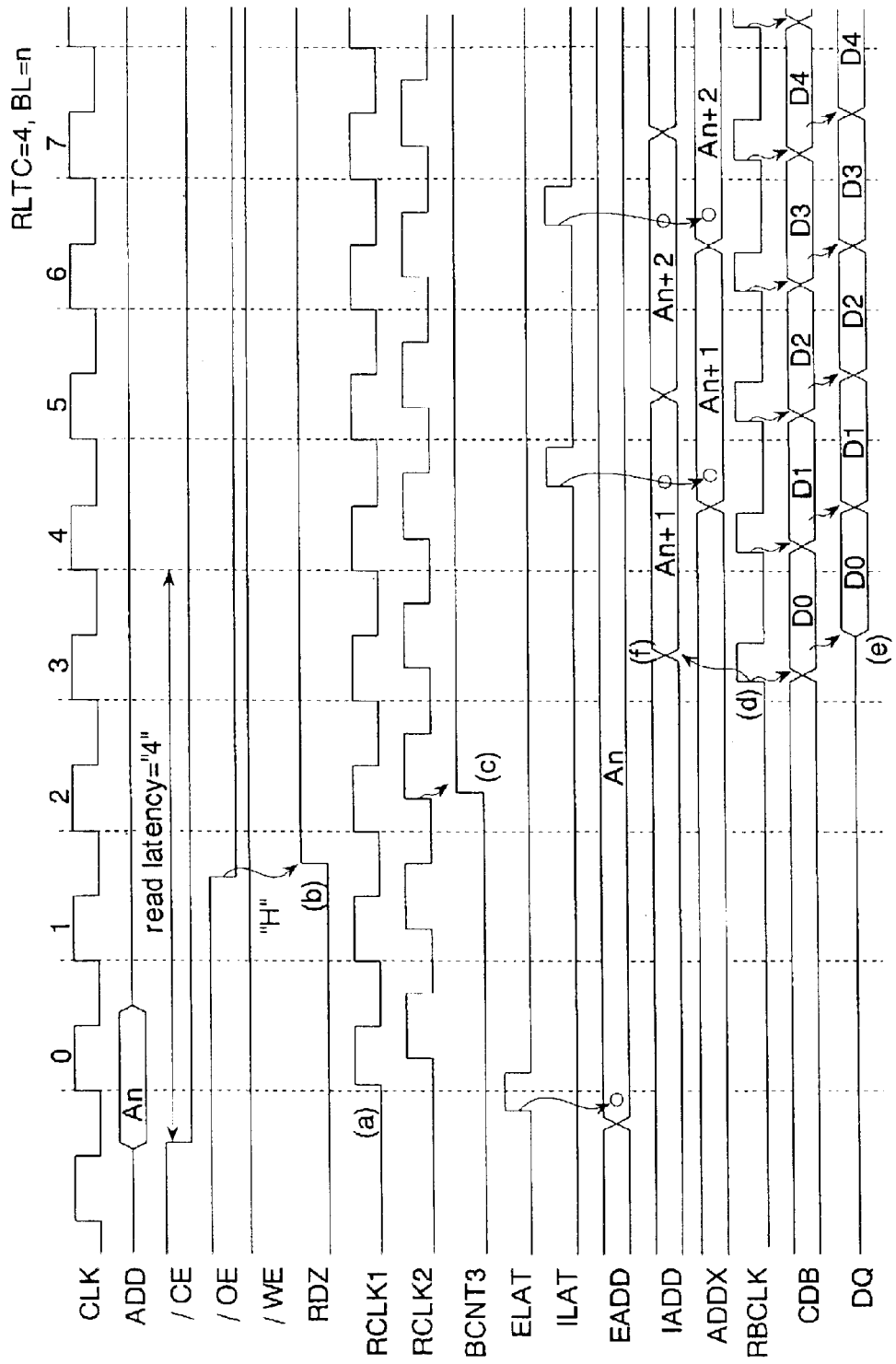
FIG. 20 is a timing diagram showing a burst read operation in the third embodiment.

FIG. 20 shows the read operation during a burst mode in the pseudo SRAM of the third embodiment. The basic timings of the read operation are the same as in the first embodiment (FIGS. 7 and 9), and hence descriptions of operations corresponding to the same operations of the first embodiment are omitted. In the present example, the read latency RLTC is set to "4".

Firstly, the clock generating circuit 46a shown in FIG. 17 is activated, by the low level of a chip enable signal /CE, to start the outputting of internal clock signals RCLK1 (FIG. 20(a)). The low level of the chip enable signal /CE and the low level of an output enable signal /OE cause a read control signal RDZ to be outputted (FIG. 20(b)). The shift register 46b causes, in synchronization with the second clock signal CLK, a count signal BCNT3 to change to a high level (FIG. 20(c)).

The combinational circuit 46c is activated, by the high levels of the read control signal RDZ and count signal BCNT3, to output clock signals CLK as read burst clock signals RBCLK (FIG. 20(d)). That is, the outputting of the read burst clock signals RBCLK is started in synchronization with the third clock signal CLK.

Thereafter, similarly to the first embodiment, read data are sequentially outputted in synchronization with the read burst clock signals RBCLK. The system incorporating the pseudo SRAM receives the first read data in synchronization with the rising edge of the fourth clock signal CLK (FIG. 20(e)).

The burst address counter 20 shown in FIG. 16 counts up by receiving, via the timing control circuit 22, a control signal outputted from the burst control circuit 46 in synchronization with the starting of the outputting of the read burst clock signals RBCLK, and then outputs the count value as an internal address signal IADD (FIG. 20(f)).

Although not shown, it should be appreciated that when the read latency RLTC is set to "1", the combinational circuit 46c is always activated. Therefore, the first read burst clock signal RBCLK is outputted in synchronization with the zeroth clock signal CLK. Then, the read data is outputted with a timing that allows the read data to be received by the system in synchronization with the first clock signal CLK.

Figure 21:
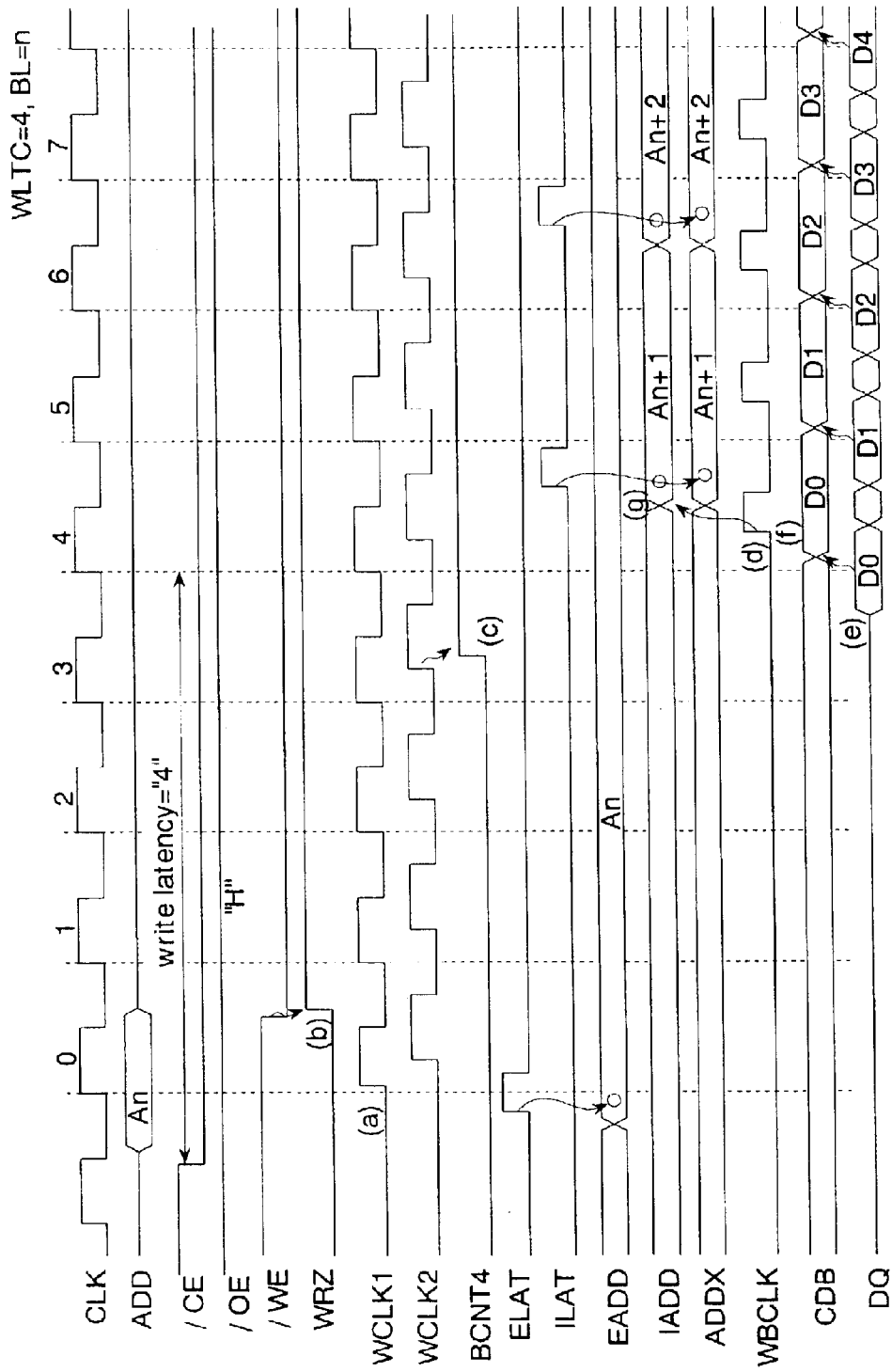
FIG. 21 is a timing diagram showing a burst write operation in the third embodiment.

FIG. 21 shows the write operation during a burst mode in the pseudo SRAM of the third embodiment. Descriptions of operations corresponding to the same operations of the first embodiment (FIG. 10) are omitted. In the present example, the write latency WLTC is set to "4".

Firstly, the clock generating circuit 46d shown in FIG. 18 is activated, by a low level of a chip enable signal /CE, to start the outputting of internal clock signals WCLK1 (FIG. 21(a)). The low level of the chip enable signal /CE and the low level of a write enable signal /WE cause a write control signal WRZ to be outputted (FIG. 21(b)). The shift register 46e causes, in synchronization with the third clock signal CLK, a count signal BCNT4 to change to a high level (FIG. 21(c)).

The combinational circuit 46f is activated, by the high levels of the write control signal WRZ and count signal BCNT4, to output clock signals CLK as write burst clock signals WBCLK (FIG. 21(d)). That is, the outputting of the write burst clock signals WBCLK is started in synchronization with the fourth clock signal CLK.

The system incorporating the pseudo SRAM outputs the first write data to the pseudo SRAM in synchronization with, for example, the falling edge of the third clock signal CLK (FIG. 21(e)). The pseudo SRAM receives this write data in synchronization with the rising edge of the fourth clock signal CLK, and transfers the write data to the common data bus CDB (FIG. 21(f)). The write data on the common data bus CDB are transferred to a data bus DB (DB0 or DB1) in synchronization with write burst clock signals WBCLK.

The burst address counter 20 shown in FIG. 16 counts up by receiving, via the timing control circuit 22, a control signal outputted from the burst control circuit 46 in synchronization with the starting of the outputting of the write burst clock signals WBCLK, and then generates the count value as an internal address signal IADD (FIG. 21(g)). Thereafter, the sequentially supplied write data are transferred to the data bus DB in synchronization with the write burst clock signals WBCLK, and then written into the memory cells MC.

Although not shown, it should be appreciated that when the write latency WLTC is set to "0", the combinational circuit 46f is always activated. Therefore, the first write burst clock signal WBCLK is outputted in synchronization with the zeroth clock signal CLK. At this moment, the system incorporating the pseudo SRAM outputs the write data with a timing that allows the write data to be received by the pseudo SRAM in synchronization with the zeroth clock signal CLK.

The present embodiment described above can provide similar effects to the foregoing first embodiment. Besides, since the outputting of read data or the inputting of write data is started later, by a predetermined latency RLTC or WLTC, than the level change of the chip enable signal /CE, the system incorporating the pseudo SRAM can easily control the pseudo SRAM. That is, the system configuration can be simplified. It should be appreciated that the pseudo SRAM triggers the level change of the chip enable signal /CE to start the data input/output operations. Therefore, the present invention can be applied not only to clock-synchronous pseudo SRAMs but also to clock-asynchronous pseudo SRAMs.

The timing of starting the outputting of read data and that of starting the inputting of write data can be set in accordance with the latencies RLTC and WLTC held in the mode register that can be set from the exterior. Therefore, the optimal latencies RLTC and WLTC can be set in accordance with the system performance.

The mode register can set the read latency RLTC and write latency WLTC independently of each other. Therefore, the latencies RLTC and WLTC can be flexibly set in accordance with the system characteristics, so that the system performance can be improved.

Figure 22:
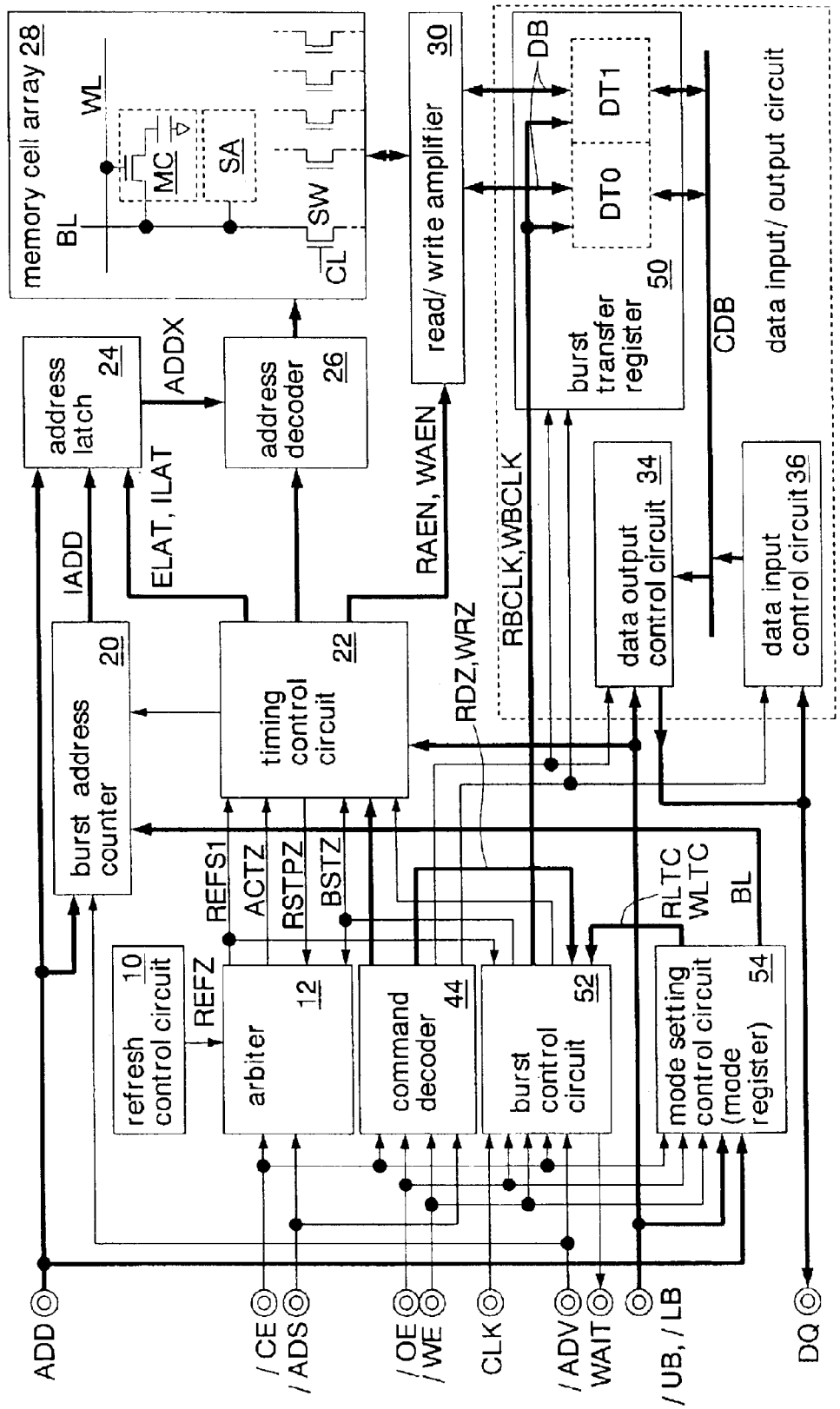
FIG. 22 is a block diagram showing a fourth embodiment of the present invention.

FIG. 22 shows a fourth embodiment of semiconductor memory according to the present invention. In this embodiment, elements corresponding to the same elements in the first and third embodiments are identified by the same reference designations, and their detailed descriptions are omitted.

According to the present embodiment, a command decoder 44, a burst control circuit 52, a mode setting control circuit 54 and a burst transfer register 50 are formed in place of the command decoder 14, burst control circuit 16, mode setting control circuit 18 and burst transfer register 32 of the first embodiment, respectively. The other structures of the present embodiment are the same as those of the first embodiment. The command decoder 44 and burst transfer register 50 are the same as the corresponding circuits of the second embodiment.

The burst control circuit 52 generates read burst clock signals RBCLK in response to a read control signal RDZ and an output enable signal /OE during a read operation. Also, the burst control circuit 52 generates write burst clock signals WBCLK in response to a write control signal WRZ and a write enable signal /WE during a write operation.

The mode setting control circuit 54 outputs a predetermined read latency signal RLTC and a predetermined write latency signal WLTC.

Figure 23:
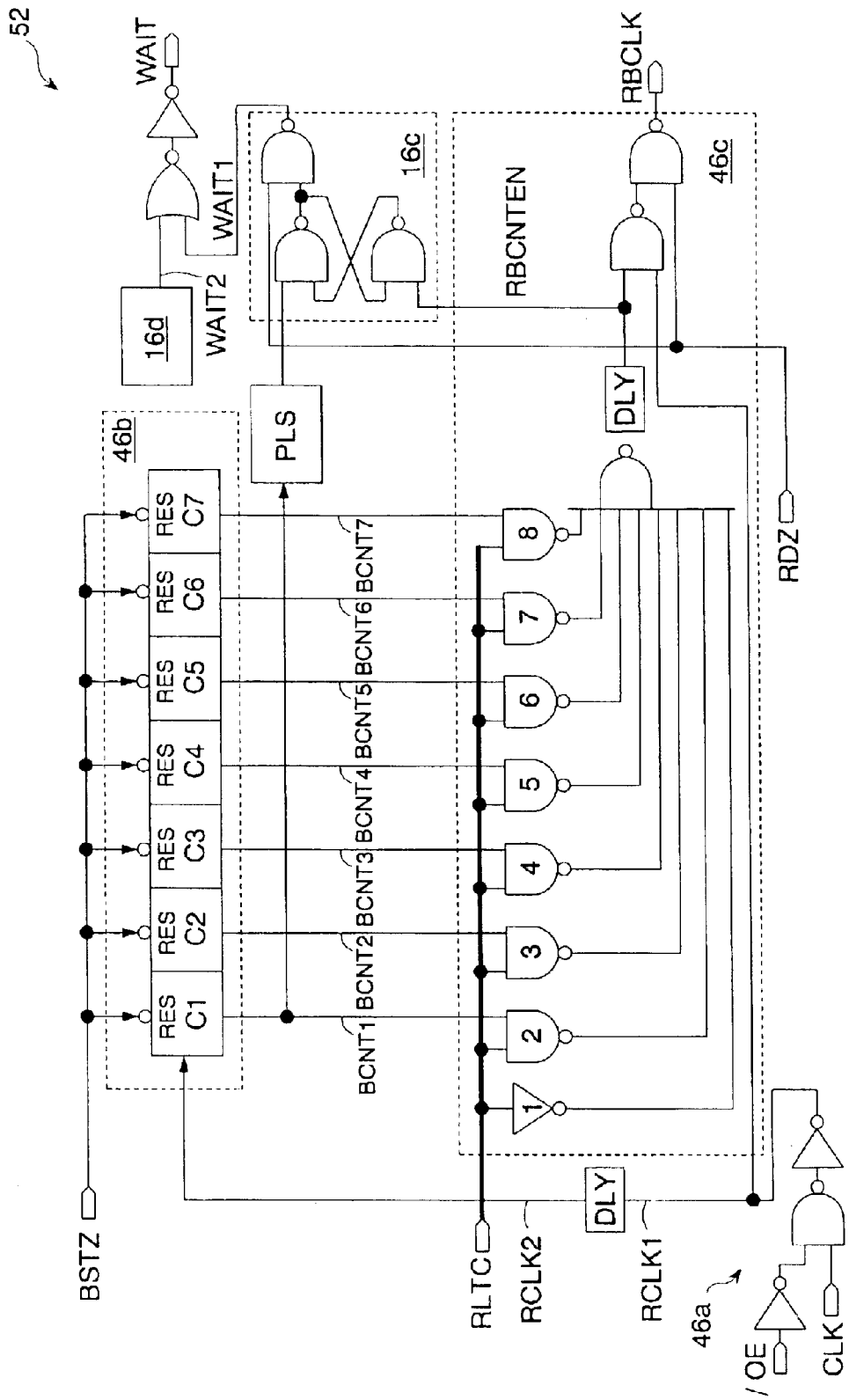
FIG. 23 is a block diagram showing essential portions of the burst control circuit of FIG. 22.
Figure 24:
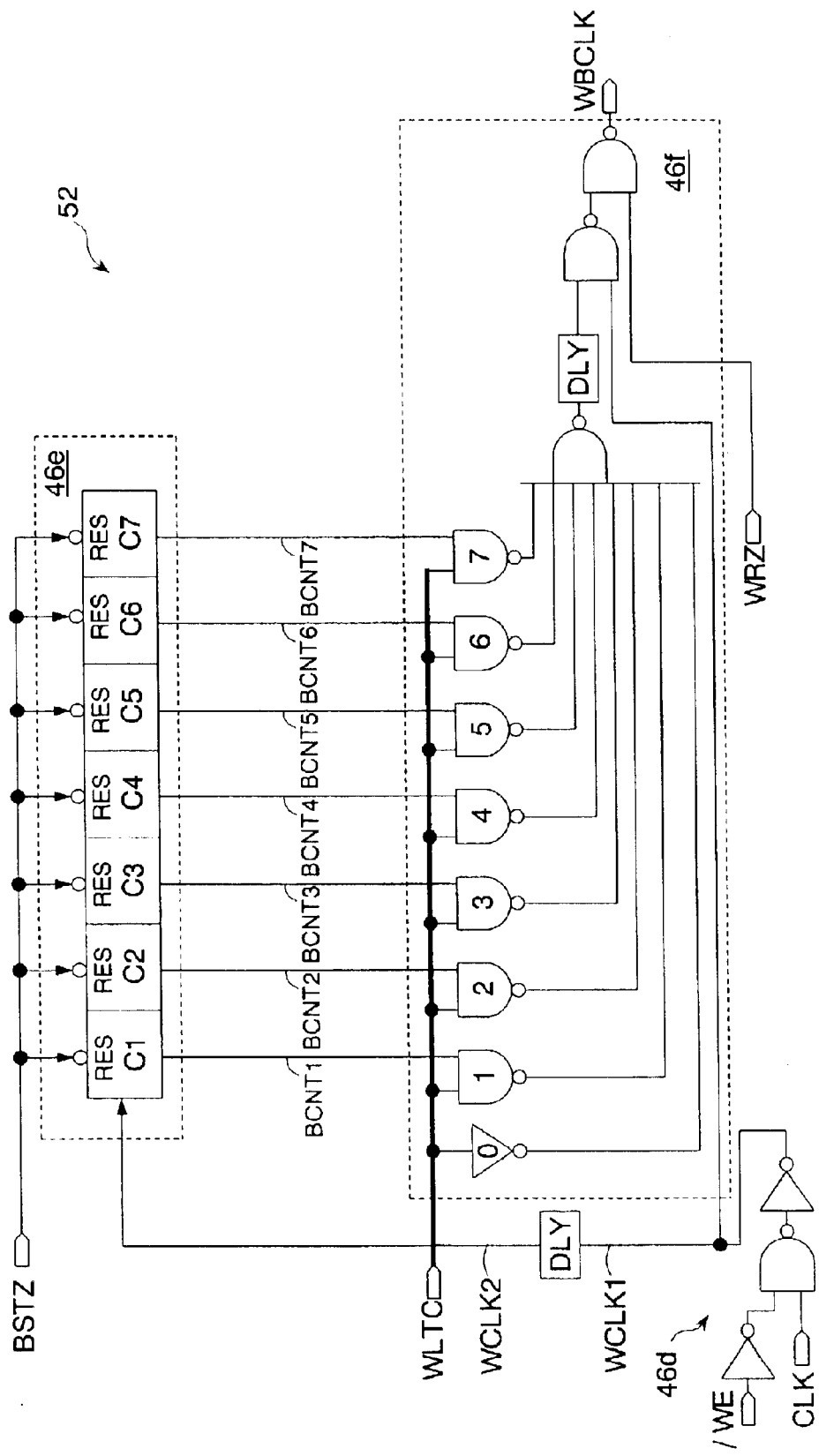
FIG. 24 is a block diagram showing the other essential portions of the burst control circuit of FIG. 22.

FIGS. 23 and 24 show the details of the burst control circuit 52 shown in FIG. 22. FIG. 23 shows a circuit portion of the burst control circuit 52 for generating the read burst clock signals RBCLK and a wait signal WAIT during the read operation, while FIG. 24 shows a circuit portion of the burst control circuit 52 for generating the write burst clock signals WBCLK during the write operation.

The burst control circuit 52 shown in FIG. 23 is the same as the corresponding circuit of the third embodiment (FIG. 17) except that the output enable signal /OE, instead of the chip enable signal /CE, is supplied to the clock generating circuit 46a. The shift register 46b and combinational circuit 46c of the burst control circuit 52 operate together as an output control circuit for starting the outputting of the read burst clock signals RBCLK after measuring a predetermined time from when the output enable signal /OE changes to its active level.

The burst control circuit 52 shown in FIG. 24 is the same as the corresponding circuit of the third embodiment (FIG. 18) except that the write enable signal /WE, instead of the chip enable signal /CE, is supplied to the clock generating circuit 46d. The shift register 46e and combinational circuit 46f of the burst control circuit 52 operate together as an output control circuit for starting the outputting of the write burst clock signals WBCLK after measuring a predetermined time from when the write enable signal /WE changes to its active level.

Figure 25:
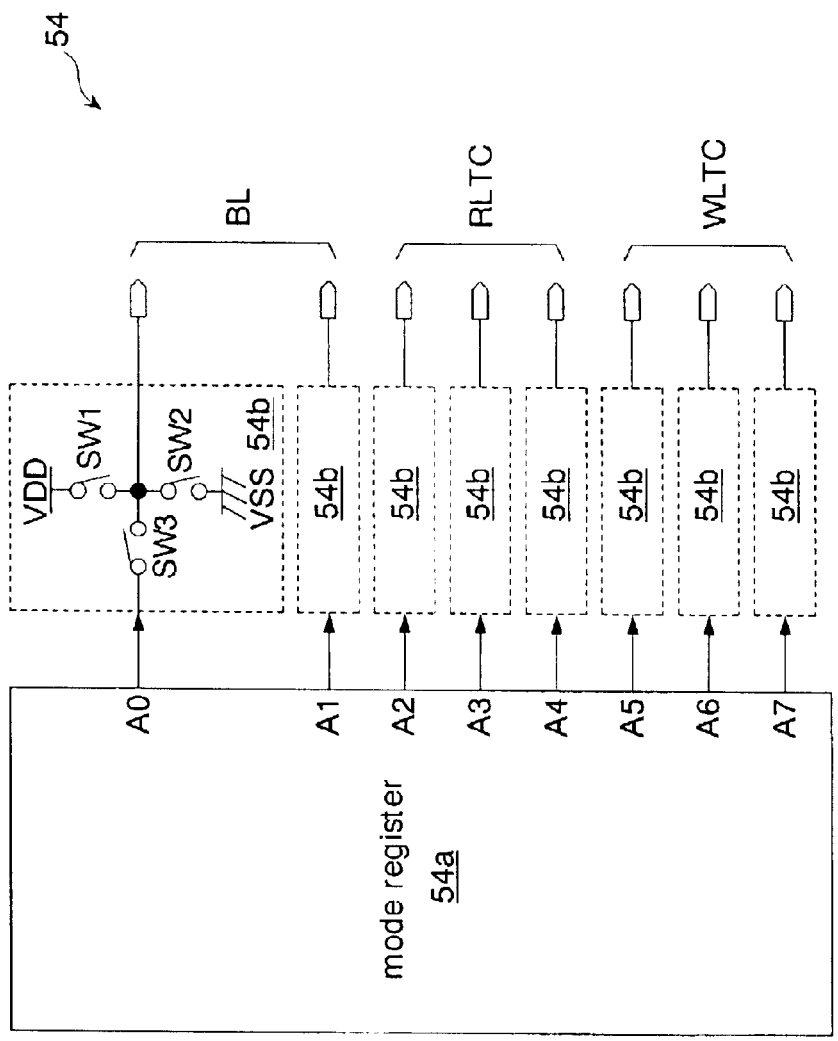
FIG. 25 is a block diagram showing the essential portions of the mode setting control circuit of FIG. 22.

FIG. 25 shows the details of the mode setting control circuit 54 shown in FIG. 22.

The mode setting control circuit 54 has a mode register 54a and switch circuits' 54b connected to the respective eight-bit outputs A0–A7 of the mode register 54a. The mode register 54a, which is the same as the mode register of the third embodiment, can set the burst length BL, read latency RLTC and write latency WLTC according to the method previously described with reference to FIG. 19.

Each of the switch circuits 54b has a switch SW1 connected to a power supply voltage VDD; a switch SW2 connected to a ground voltage VSS; and a switch SW3 connected to a respective one of the outputs of the mode register 54a. One of the switches SW1, SW2 and SW3 is rendered conductive in the fabrication process (wiring process) of the pseudo SRAM.

More particularly, two photomasks to be used in the wiring process are prepared in advance. In one of the two photomasks, there is formed a wiring pattern that renders the switch SW3 of each of the switch circuits 54b conductive, while in the other photomask, there is formed a wiring pattern that renders the switch SW1 or SW2 of each of the switch circuits 54b conductive. Then, the photomasks are selectively used to fabricate products in which the burst length BL and latencies RLTC and WLTC can be modified in accordance with the values of the mode register 54a and products in which the burst length BL and latencies RLTC and WLTC are fixed to predetermined values.

The mode setting control circuit 54 outputs the burst length BL and latencies RLTC and WLTC in accordance with the switches (SW1, SW2 or SW3) formed on the substrate of the pseudo SRAM in accordance with the wiring pattern of one of the photomasks selectively used in the fabrication process. The burst control circuit 52 outputs the burst clock signals RBCLK (or WBCLK) with a timing that is in accordance with the burst length BL and latencies RLTC and WLTC outputted from the mode setting control circuit 54. In other words, the burst control circuit 52 measures the time corresponding to the latency RLTC (or WLTC) that is in accordance with the voltage value of what is connected to the conductive pattern of the switch circuits 54b, and starts, after the measurement, the outputting of the burst clock signals RBCLK (or WBCLK).

Figure 26:
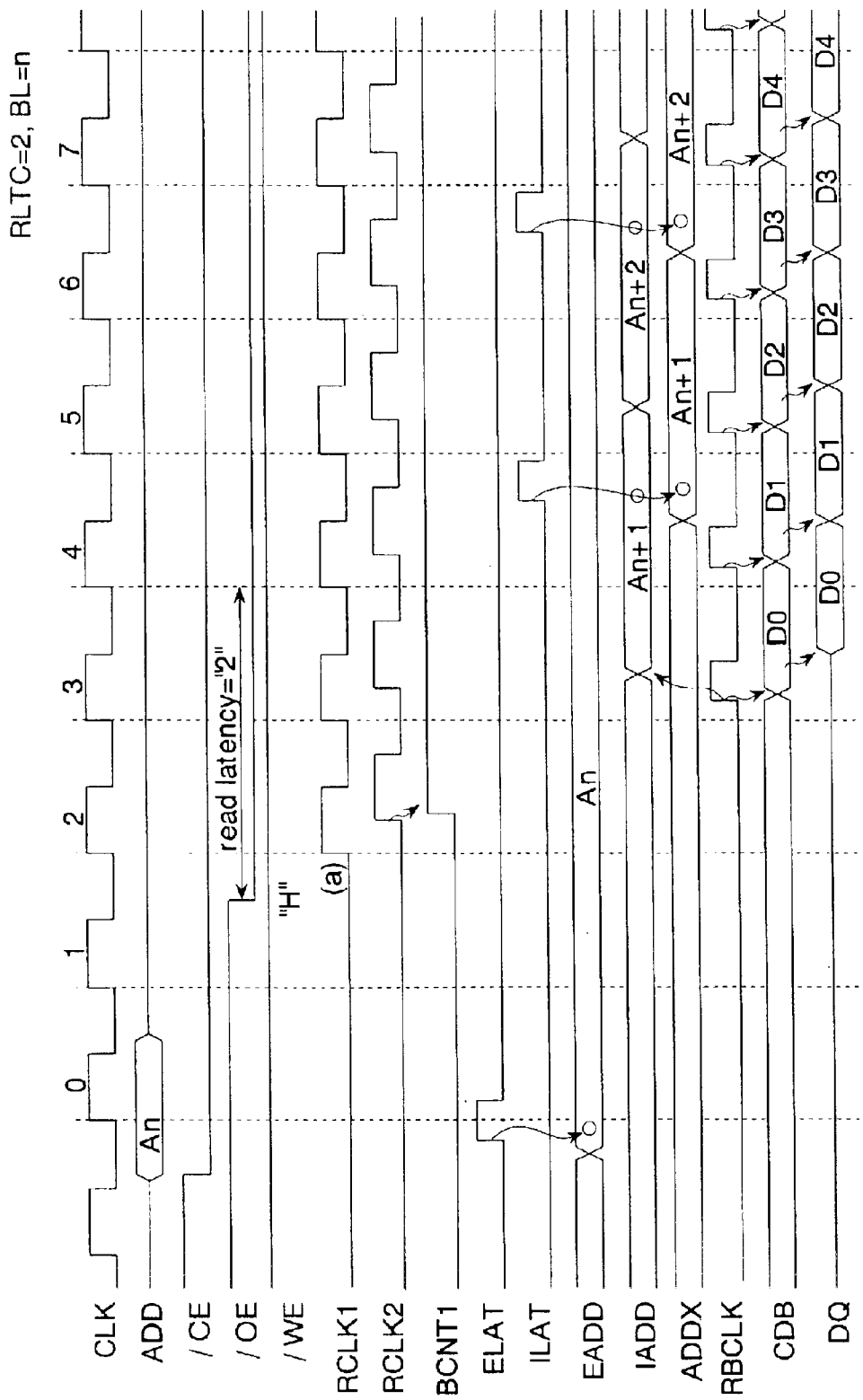
FIG. 26 is a timing diagram showing a burst read operation in the fourth embodiment.

FIG. 26 shows the read operation during a burst mode in the pseudo SRAM of the fourth embodiment. In the present example, the read latency RLTC is set to "2". The read latency RLTC is the number of clocks from when an output enable signal /OE is activated till when the first read data is outputted.

The burst control circuit 52 starts the outputting of internal clock signals RCLK1 in response to the activation of an output enable signal /OE during the read operation (FIG. 26(a)). The basic timings of the following operations during the burst read operation are the same as in the third embodiment (FIG. 20), and hence their descriptions are omitted.

Figure 27:
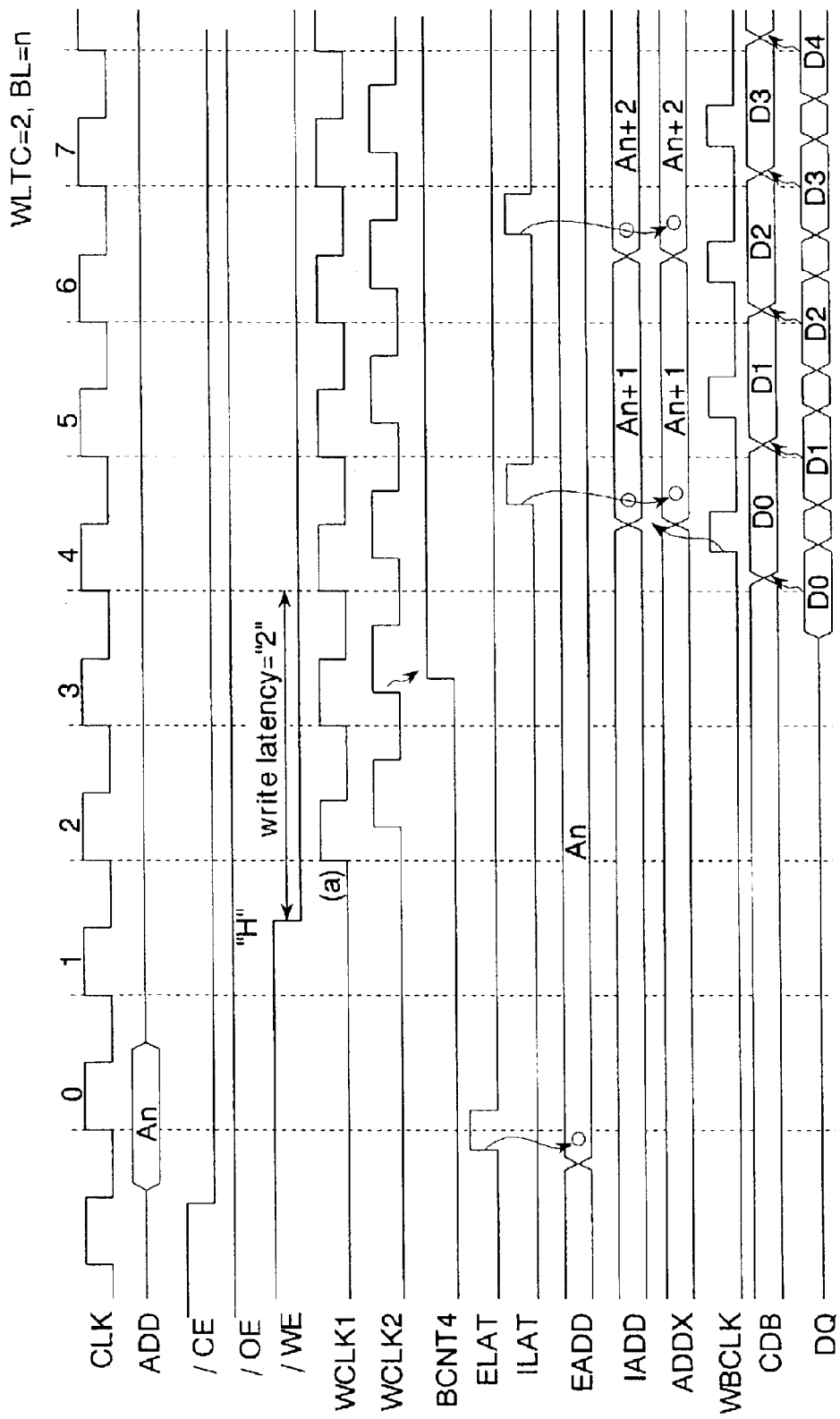
FIG. 27 is a timing diagram showing a burst write operation in the fourth embodiment.

FIG. 27 shows the write operation during a burst mode in the pseudo SRAM of the fourth embodiment. In the present example, the write latency WLTC is set to "2". The write latency WLTC is the number of clocks from when a write enable signal /WE is activated till when the first write data is inputted.

The burst control circuit 52 starts the outputting of internal clock signals WCLK1 in response to the activation of a write enable signal /WE during the write operation (FIG. 27(a)). The basic timings of the following operations during the burst write operation are the same as in the third embodiment (FIG. 21), and hence their descriptions are omitted.

The present embodiment described above can provide similar effects to the foregoing first and third embodiments. Besides, since the latencies RLTC and WLTC can be set by selectively using the photomasks, they can be set in accordance with the product specifications (operating frequencies and the like) of the semiconductor memories to be shipped. The present embodiment is especially advantageous in a case where pseudo SRAMs fabricated through the same fabrication process and having sufficient margin in operating frequency are shipped as different products having different operating frequencies according to the selective use of the photomasks.

Figure 28:
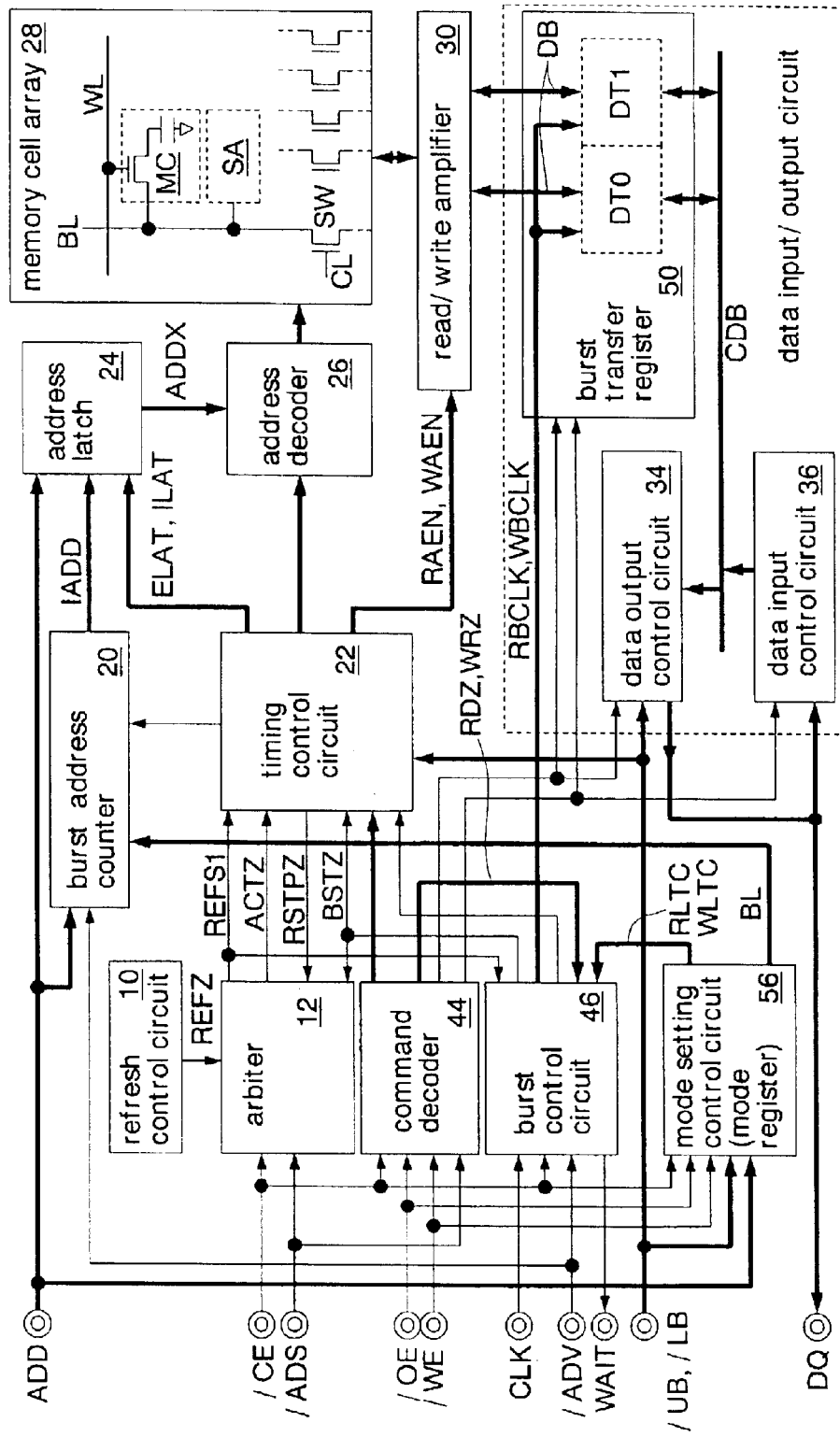
FIG. 28 is a block diagram showing a fifth embodiment of the present invention.

FIG. 28 shows a fifth embodiment of semiconductor memory according to the present invention. In this embodiment, elements corresponding to the same elements in the first and third embodiments are identified by the same reference designations, and their detailed descriptions are omitted.

According to the present embodiment, a command decoder 44, a burst control circuit 46, a mode setting control circuit 56 and a burst transfer register 50 are formed in place of the command decoder 14, burst control circuit 16, mode setting control circuit 18 and burst transfer register 32 of the first embodiment, respectively. The other structures of the present embodiment are the same as those of the first embodiment. The command decoder 44, burst control circuit 46 and burst transfer register 50 are the same as the corresponding circuits of the second embodiment.

Figure 29:
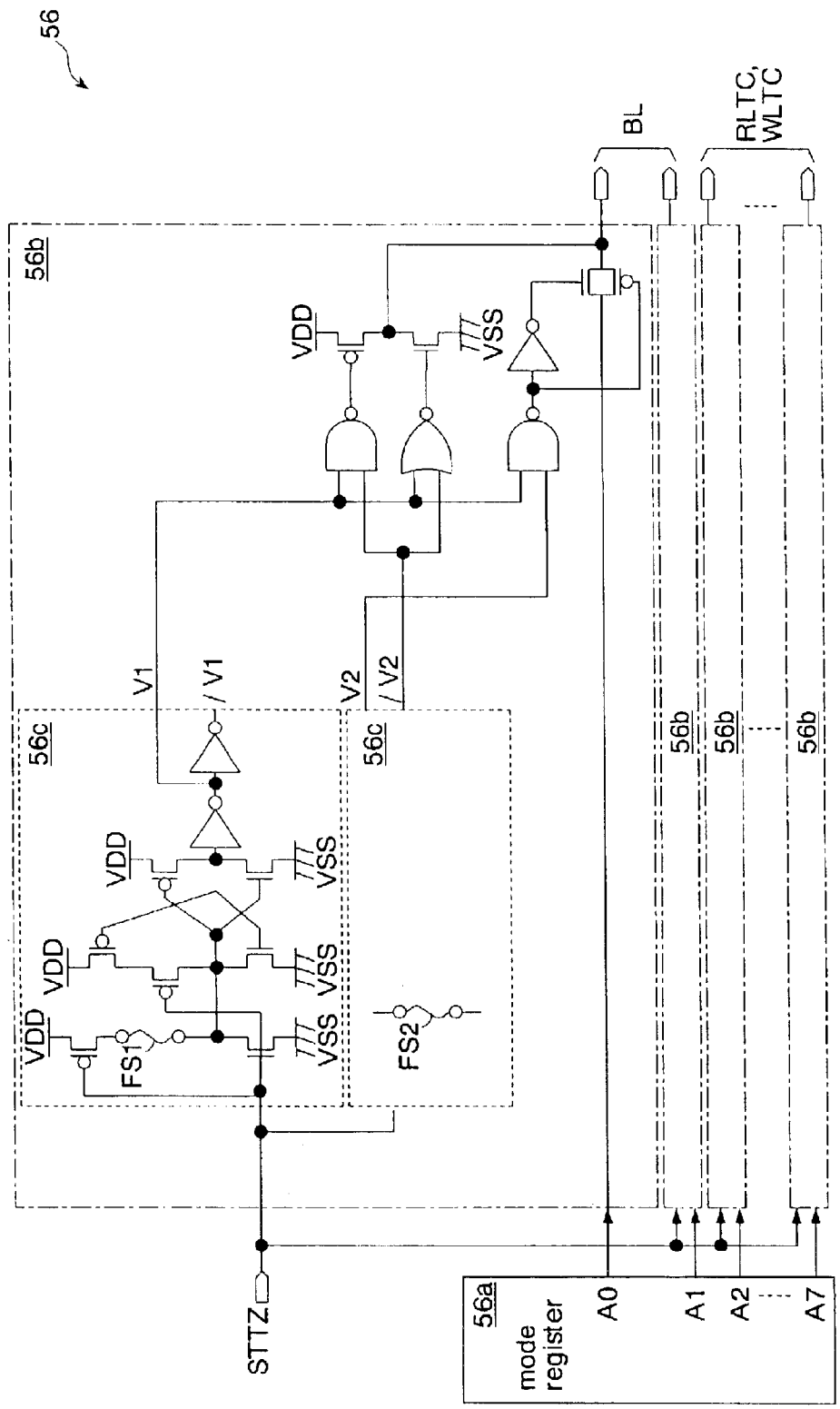
FIG. 29 is a block diagram showing the essential portions of the mode setting control circuit of FIG. 28.

FIG. 29 shows the details of the mode setting control circuit 56.

The mode setting control circuit 56 has a mode register 56a and mode setting circuits 56b that receive the respective eight-bit outputs A0–A7 of the mode register 56a. The mode register 56a, which is the same as the mode register of the third embodiment, can set the burst length BL, read latency RLTC and write latency WLTC according to the method previously described with reference to FIG. 19.

Each of the mode setting circuits 56b has two fuse circuits 56c in each of which one-bit data is programmed. The fuse circuit's 56c, which are initialized by a starter signal STTZ (a power-on reset signal) that temporarily exhibits a high level at a power-on of the pseudo SRAM, output logic values in accordance with the program conditions of fuses FS1 and FS2. When the fuse FS1 has been programmed (in a cut condition), signals V1 and /V1 change to low and high levels, respectively. When the fuse FS1 has not been programmed (in a not-yet-cut condition), the signals V1 and /V1 change to high and low levels, respectively. Similarly, when the fuse FS2 has been programmed (in a cut condition), signals V2 and /V2 change to low and high levels, respectively. When the fuse FS2 has not been programmed (in a not-yet-cut condition), the signals V2 and /V2 change to high and low levels, respectively.

According to the present embodiment, in a case of fabricating products wherein the burst length BL, read latency RLTC and write latency WLTC can be modified in accordance with the values set in the mode register 56a, the fuses FS1 and FS2 of each of the mode setting circuits 56b are placed in the not-yet-cut condition in a test process. At this moment, in each of the mode setting circuits 56b, a NAND gate, which is the lower one of two NAND gates as shown in FIG. 29, outputs a low level, which turns on a CMOS transfer gate. Then, the values set in the mode register 56a are outputted as the burst length BL, read latency RLTC and write latency WLTC.

In a case of fixing the burst length BL, read latency RLTC and write latency WLTC to predetermined values, the fuse FS1 or FS2 of each of the mode setting circuits 56b is cut in the fabrication process. At this moment, the CMOS transfer gates are turned off, so that the outputs of the mode register 56a are masked. If the fuse FS1 is cut and the fuse FS2 is not cut, a ground voltage VSS is outputted. Conversely, if the fuse FS2 is cut and the fuse FS1 is not cut, a power supply voltage VDD is outputted. That is, each of the mode setting circuits 56b outputs a high or low level in accordance with the programmed condition of the fuses FS1 and FS2. In this way, products wherein the burst length BL, read latency RLTC and write latency WLTC are fixed to predetermined values are fabricated.

Thus, the mode setting control circuit 56 outputs to the burst address counter 20 and the burst control circuit 46 the burst length BL, read latency RLTC and write latency WLTC in accordance with the programmed conditions of the fuses FS1 and FS2. In other words, the burst control circuit 46 measures the time corresponding to the latency RLTC (or WLTC) that is in accordance with the programmed conditions of the fuses FS1 and FS2, and starts, after the measurement, the outputting of the burst clock signals RBCLK (or WBCLK).

The burst read and write operations in the present embodiment are the same as those in the third embodiment, and hence their descriptions are omitted.

The present embodiment described above can provide similar effects to the foregoing first and third embodiments. Besides, the latencies RLTC and WLTC can be set by programming the fuses FS1 and FS2. Therefore, programming the fuses FS1 and FS2 in accordance with the highest operating frequency as evaluated in a probe test can set the foregoing predetermined time in accordance with the actual performance of fabricated pseudo SRAMs. The present embodiment is especially advantageous in a case where pseudo SRAMs fabricated by using the same photomask and the same fabrication process are classified into and shipped as different products according to their respective actual performances in operating frequency.

The foregoing first and second embodiments are described as examples wherein the latency LTC during the burst read operation is set to "4". The present invention, however, is not limited to such embodiments. The latency LTC may be set to an optimum value in accordance with the clock cycle.

The present invention is described as examples wherein the codes CODE5 and CODE6 for setting the burst length BL and latencies LTC in the mode register are received at the address terminals. The present invention, however, is not limited to such examples. For example, the command or data terminals may be used instead to receive the codes CODE5 and CODE6.

Figure 30:
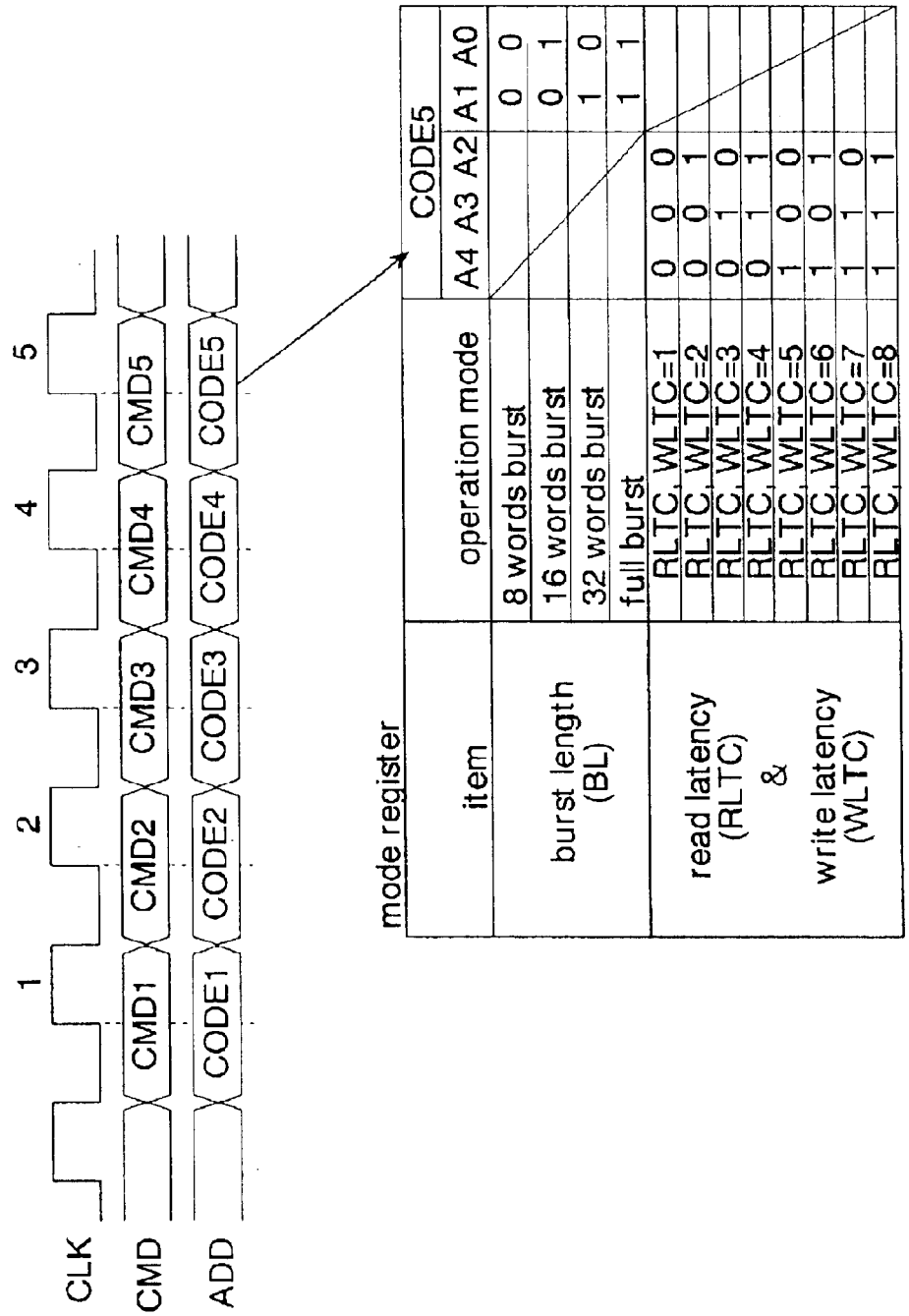
FIG. 30 is an explanatory diagram showing another example of mode register.

The foregoing third, fourth and fifth embodiments are described as examples wherein the read and write latencies RLTC and WLTC are set independently of each other. The present invention, however, is not limited to such embodiments. For example, as shown in FIG. 30, the bits A4–A2 of the mode register may be common to the read and write latencies RLTC and WLTC. Instead, the write latency WLTC may be set to be always smaller than the read latency RLTC by "1". In such a case, the number of the bits of the mode register can be reduced.

The invention is not limited to the above embodiments and various modifications may be made without departing from the spirit and scope of the invention. Any improvement may be made in part or all of the components.

What is claimed is:

1. A semiconductor memory comprising:
   a memory cell array composed of volatile memory cells each having a capacitor;
   a refresh control circuit for generating in a predetermined cycle a refresh request for refreshing said memory cells;
   a first burst control circuit for outputting a strobe signal having a predetermined number of pulses after receiving an access command and a predetermined number of clocks, the access command being a command for successively burst accessing said memory cell array;
   a data input/output circuit for successively inputting/outputting data to be transferred to/from said memory cell array, in synchronization with each of said predetermined number of pulses of said strobe signal; and
   an arbiter for determining which of a refresh operation and a burst access operation is to be executed first, when said refresh request and said access command conflict with each other.

2. The semiconductor memory according to claim 1, wherein
   said arbiter comprises a refresh holding part for holding said refresh request during said burst access operation when said burst access operation is executed first.

3. The semiconductor memory according to claim 2, further comprising:
   a second burst control circuit for outputting a burst signal corresponding to a period during which said strobe signal having a predetermined number of pulses are outputted, wherein
   said refresh holding part holding said refresh request outputs a refresh starting signal for starting said refresh operation, in response to a completion of the output of said burst signal.

4. The semiconductor memory according to claim 2, wherein
   after operation of said memory cell array, said refresh holding part holding said refresh request outputs a refresh starting signal for starting said refresh operation without waiting for a completion of data output from said data input/output circuit.

5. The semiconductor memory according to claim 2, further comprising a plurality of word lines each connected to a predetermined number of memory cells of said memory cells; and having a full burst function for sequentially selecting said plurality of word lines to access said memory cells in accordance with said access command, wherein
   when switching selections of said word lines, said refresh holding part holding said refresh request during a full burst, outputs a refresh starting signal for starting said refresh operation.

6. The semiconductor memory according to claim 2, wherein:
   said data input/output circuit comprises a data register for converting parallel read data transferred from said memory cell array into serial data; and
   said refresh holding part holding said refresh request outputs a refresh starting signal for starting said refresh operation, before said data register completes output of said serial data.

7. The semiconductor memory according to claim 1, wherein
   said arbiter comprises an access holding part for holding said access command during said refresh operation when said refresh operation is executed first.

8. The semiconductor memory according to claim 1, further comprising an address counter for receiving an external address supplied corresponding to said access command and for sequentially generating internal addresses following said external address.

9. The semiconductor memory according to claim 8, wherein said data input/output circuit comprises a data register for holding read data outputted from the memory cells designated by said external and internal addresses and for sequentially outputting the held read data to a common data bus in synchronization with each of said predetermined number of pulses of said strobe signal.

10. The semiconductor memory according to claim 9, wherein said memory cell array is inactivated after said read data are transferred to said data register.

11. The semiconductor memory according to claim 8, wherein said data input/output circuit comprises a data register for sequentially holding, in synchronization with each of said predetermined number of pulses of said strobe signal, write data to be transferred to the memory cells designated by said external and internal addresses, and for outputting the held write data to said memory cell array.

12. The semiconductor memory according to claim 1, wherein said first burst control circuit outputs said strobe signal in synchronization with an external clock signal.

13. The semiconductor memory according to claim 1, further comprising:

a chip enable terminal for receiving from the exterior of the semiconductor memory a chip enable signal for activating internal circuits; and an address status terminal for receiving from the exterior of the semiconductor memory an address status signal indicative of validity of an external address, wherein said arbiter detects a supply of said access command when at least one of said chip enable signal and said address status signal is inputted.

14. The semiconductor memory according to claim 1, further comprising:

a wait terminal for outputting to the exterior of the semiconductor memory a wait signal indicative of invalidity of data output terminals during a period from reception of said access command to output of read data.

15. The semiconductor memory according to claim 8, further comprising:

an address status terminal for receiving from the exterior of the semiconductor memory an address status signal indicative of validity of said external address.

16. The semiconductor memory according to claim 1, further comprising:

a plurality of data input/output terminals for inputting/outputting data;

a plurality of data terminal groups each made up of a predetermined number of data input/output terminals, of said data input/output terminals; and a plurality of data valid terminals for receiving from the exterior of the semiconductor memory data valid signals indicative of validity of data transferred respectively to said data terminal groups.

17. The semiconductor memory according to claim 16, wherein said data input/output circuit comprises output buffers each for inhibiting output of read data transferred from said memory cell array during invalidity of said data valid signals, said output buffers corresponding to said data terminal groups.

18. The semiconductor memory according to claim 16, further comprising:

a plurality of column switches for connecting said memory cells to said data input/output circuit;

a plurality of column switch groups each constituted of a predetermined number of column switches of said column switches, and corresponding to said data terminal groups; and a control circuit for turning off, when one of said data valid signals is invalid, the column switches of one of said column switch groups corresponding to the invalid data valid signal.

19. The semiconductor memory according to claim 1, further comprising:

a burst advance terminal for receiving from the exterior of the semiconductor memory a burst advance signal for temporarily suspending said burst access operation to maintain output of read data.

20. The semiconductor memory according to claim 1, further comprising:

a mode setting control circuit for receiving, as a set signal for setting an operation mode, a signal supplied to at least one of external input terminals after said external input terminals receive signals of predetermined logic values a plurality of times successively.

21. The semiconductor memory according to claim 20, wherein said mode setting control circuit comprises a mode register for setting a latency that is a number of clocks from reception of said access command to start of read data output.

22. The semiconductor memory according to claim 20, wherein said mode setting control circuit comprises a mode register for setting a burst length that is a number of times data are successively inputted or outputted.

23. The semiconductor memory according to claim 1, wherein said first burst control circuit comprises:

a level detecting circuit for detecting that one of command signals supplied as said access command turns to its active level; and an output control circuit for starting outputting said strobe signals after receiving a predetermined number of clocks from the detection of said level detecting circuit.

* * * * *